United States Patent
Fukaya et al.

(10) Patent No.: US 7,682,140 B2
(45) Date of Patent: Mar. 23, 2010

(54) MOLD FOR RESIN MOLDING, RESIN MOLDING APPARATUS, AND SEMICONDUCTOR DEVICE MANUFACTURE METHOD

(75) Inventors: Futoshi Fukaya, Kawasaki (JP); Yoshitsugu Katoh, Kawasaki (JP)

(73) Assignee: Fujitsu Microelectronics Limited, Yokohama (JP)

( * ) Notice: Subject to any disclaimer, the term of this patent is extended or adjusted under 35 U.S.C. 154(b) by 161 days.

(21) Appl. No.: 11/655,882

(22) Filed: Jan. 22, 2007

(65) Prior Publication Data

US 2007/0231956 A1 Oct. 4, 2007

(30) Foreign Application Priority Data

Mar. 30, 2006 (JP) .............................. 2006-094703

(51) Int. Cl.
*B28B 17/00* (2006.01)

(52) U.S. Cl. ........................... 425/3; 425/116; 425/215; 425/544

(58) Field of Classification Search .................. 438/115; 425/3, DIG. 33, 116, 215, 544
See application file for complete search history.

(56) References Cited

U.S. PATENT DOCUMENTS 2,790,203 A * 4/1957 Dykehouse ................. 425/550

FOREIGN PATENT DOCUMENTS

| JP | 61-232628 A | 10/1986 |
|---|---|---|
| JP | 03250635 A * | 11/1991 |
| JP | 2002-313824 A | 10/2002 |

* cited by examiner

*Primary Examiner*—Joseph S Del Sole
*Assistant Examiner*—James Sanders
(74) *Attorney, Agent, or Firm*—Fujitsu Patent Center

(57) ABSTRACT

A mold includes a pot for accommodating resin, a cavity for accommodating a semiconductor chip to be resin-molded and a runner as a resin passage for transporting the resin accommodated in the pot to the cavity. A foreign matter retention pocket is disposed which is a recess formed by digging further a partial inner surface of the runner. A runner magnet attracts and attaches a metallic foreign matter contained in fluid transported in the runner to the inner surface of the foreign matter retention pocket.

5 Claims, 18 Drawing Sheets

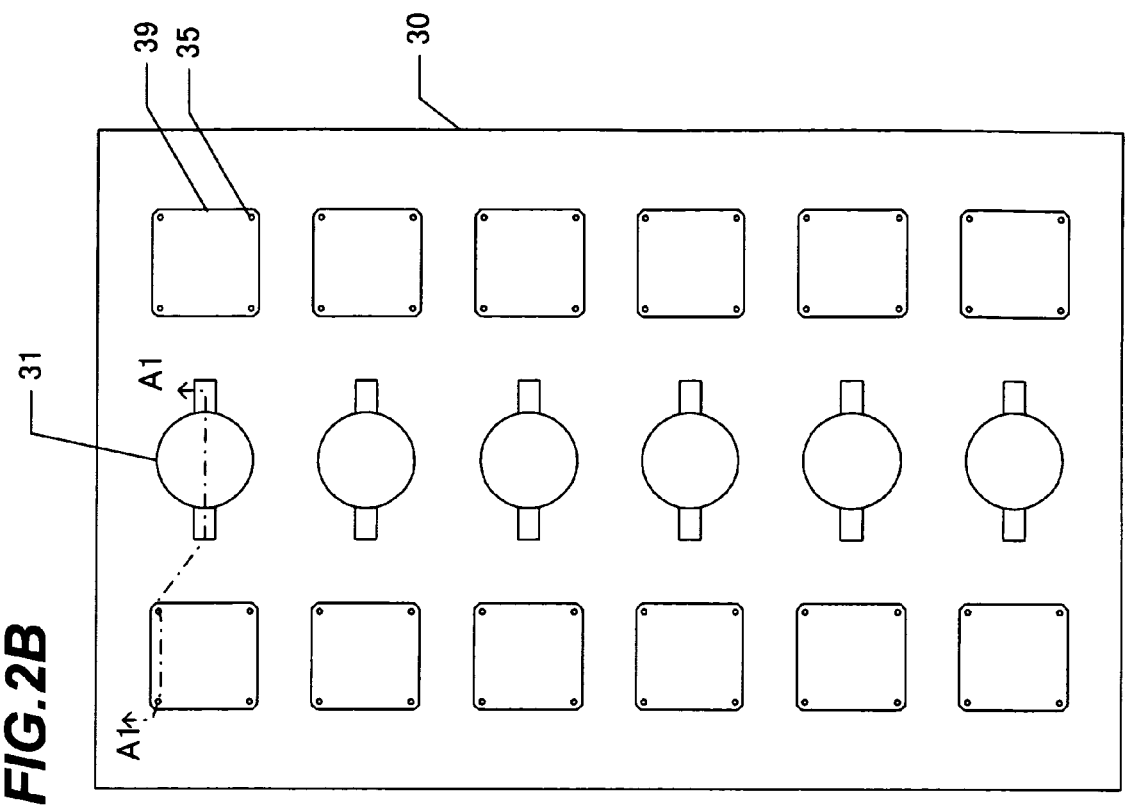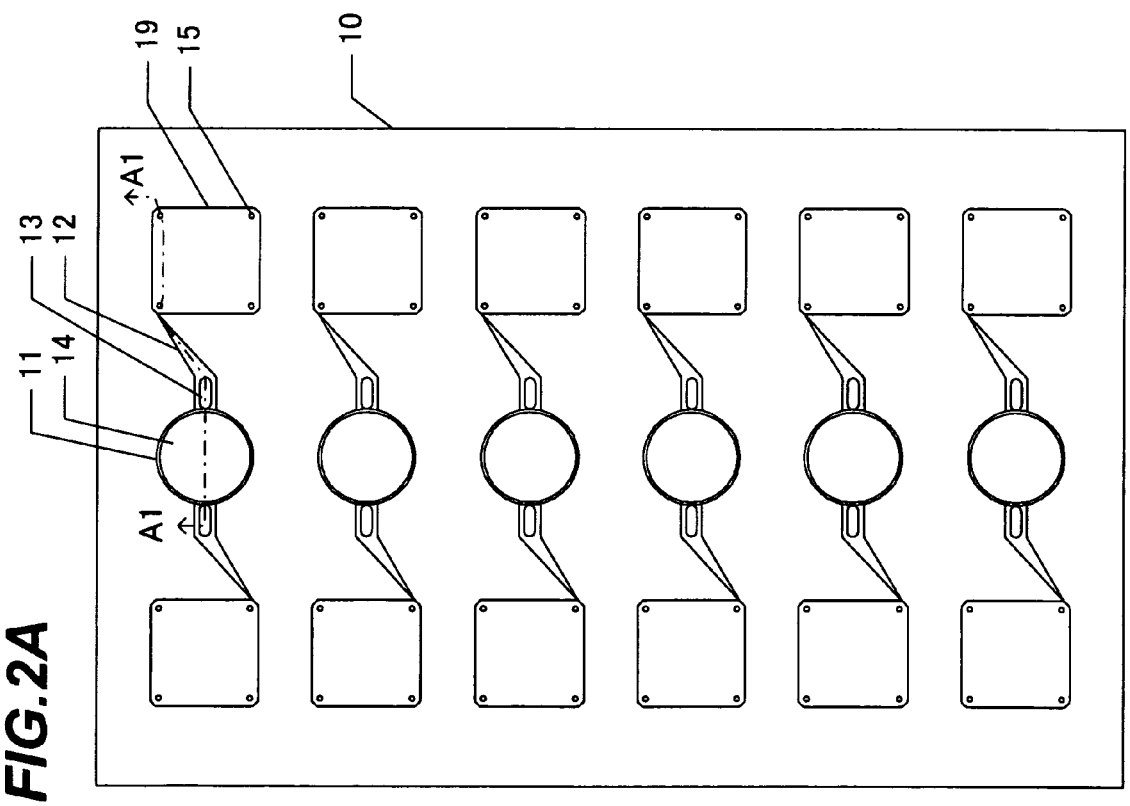

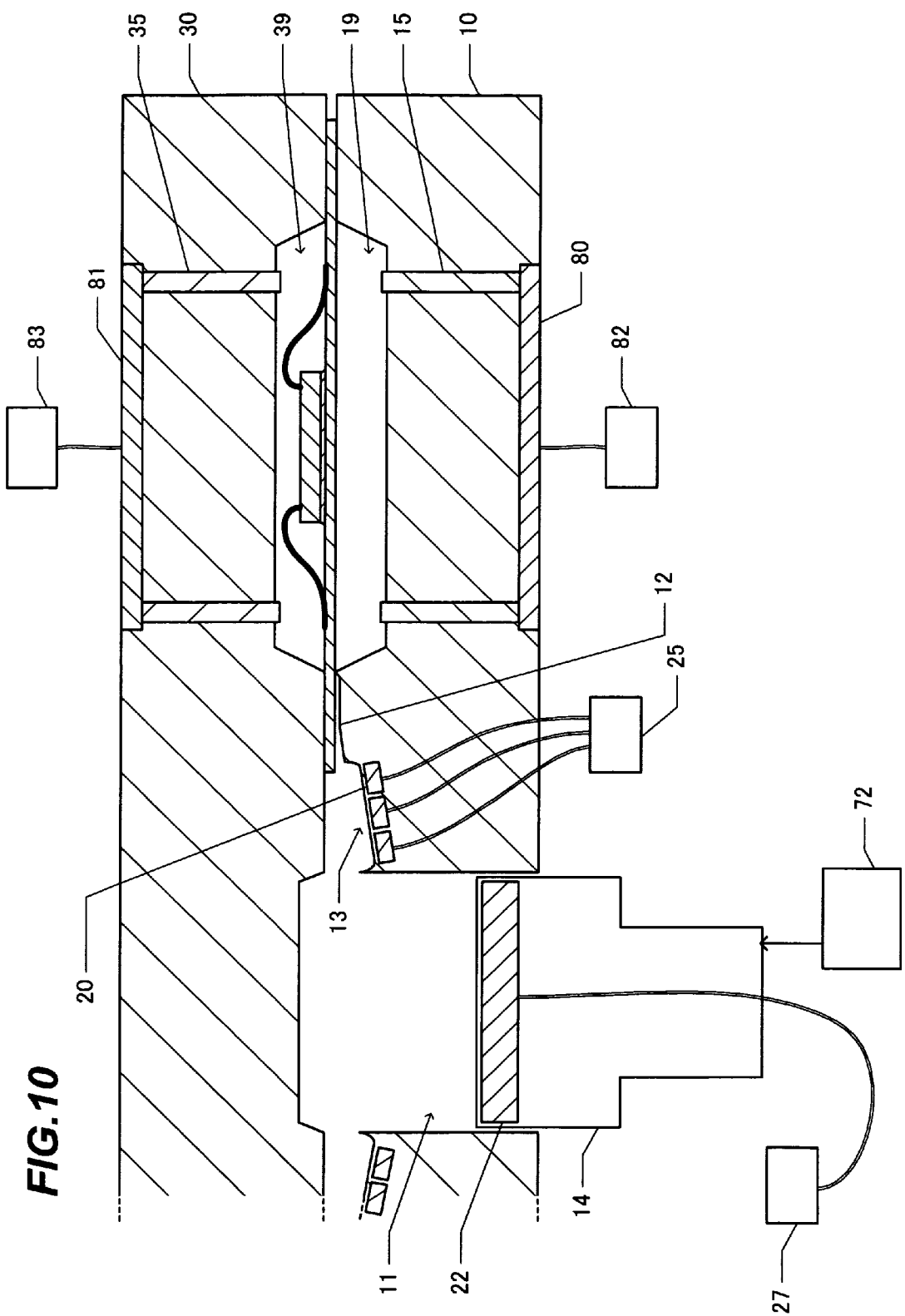

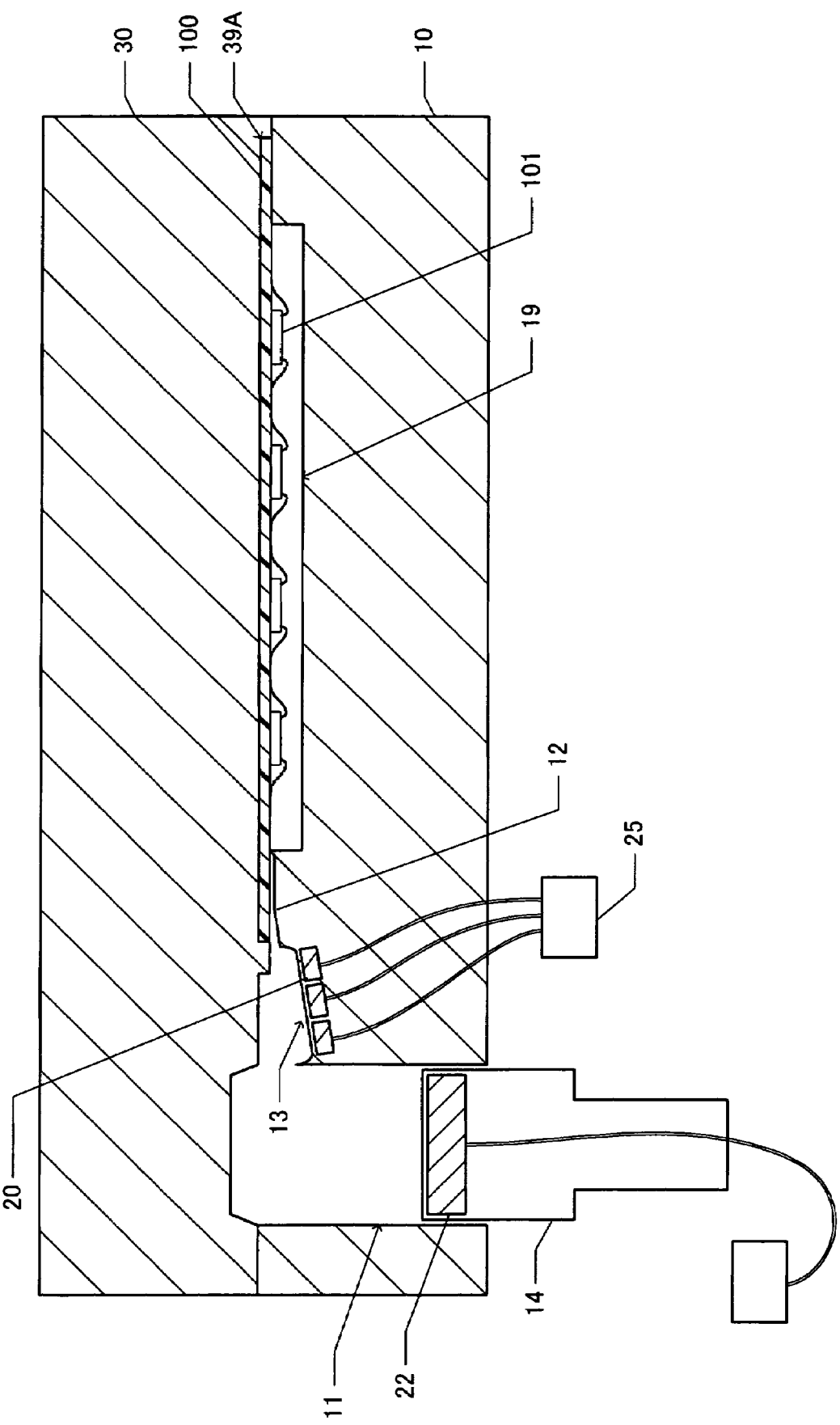

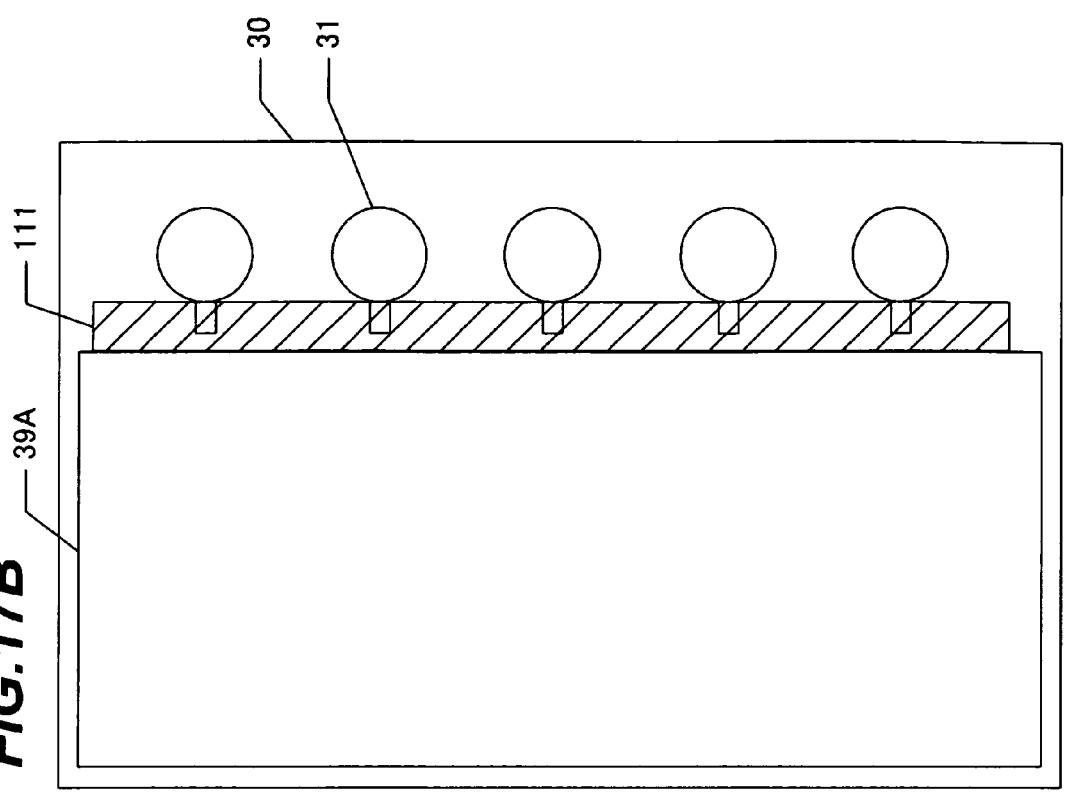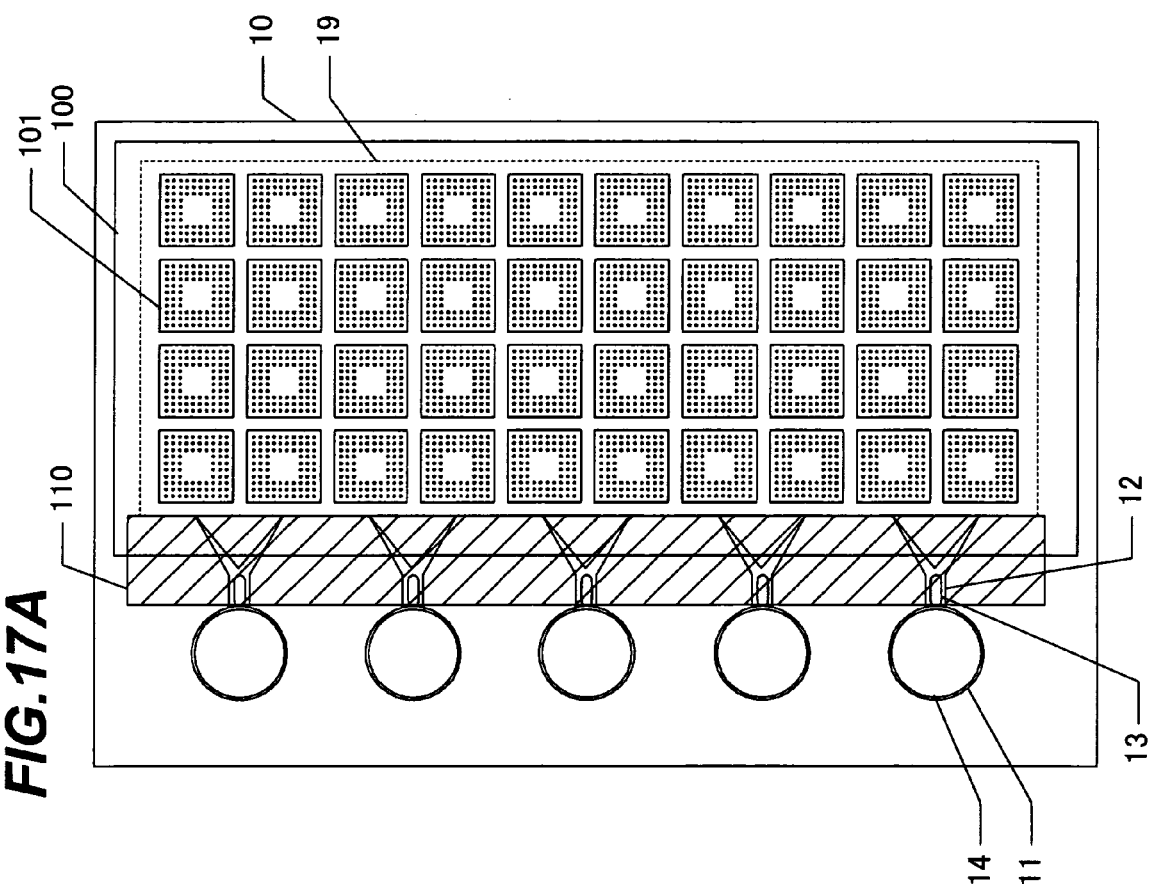

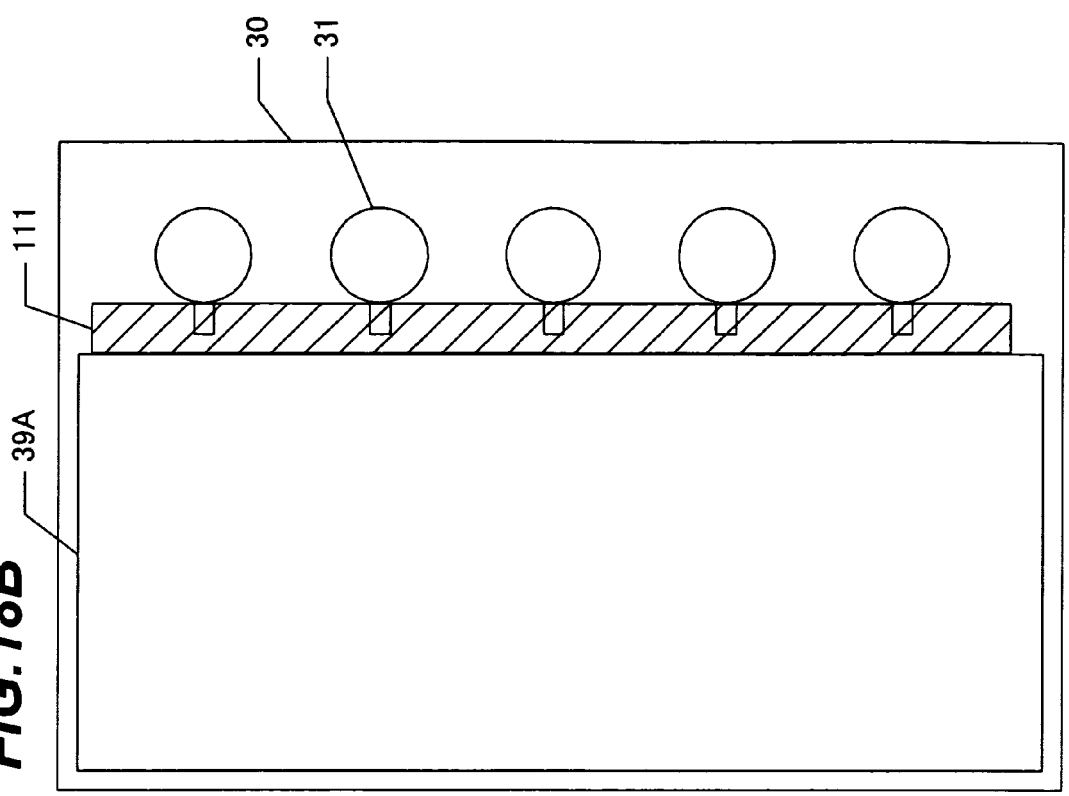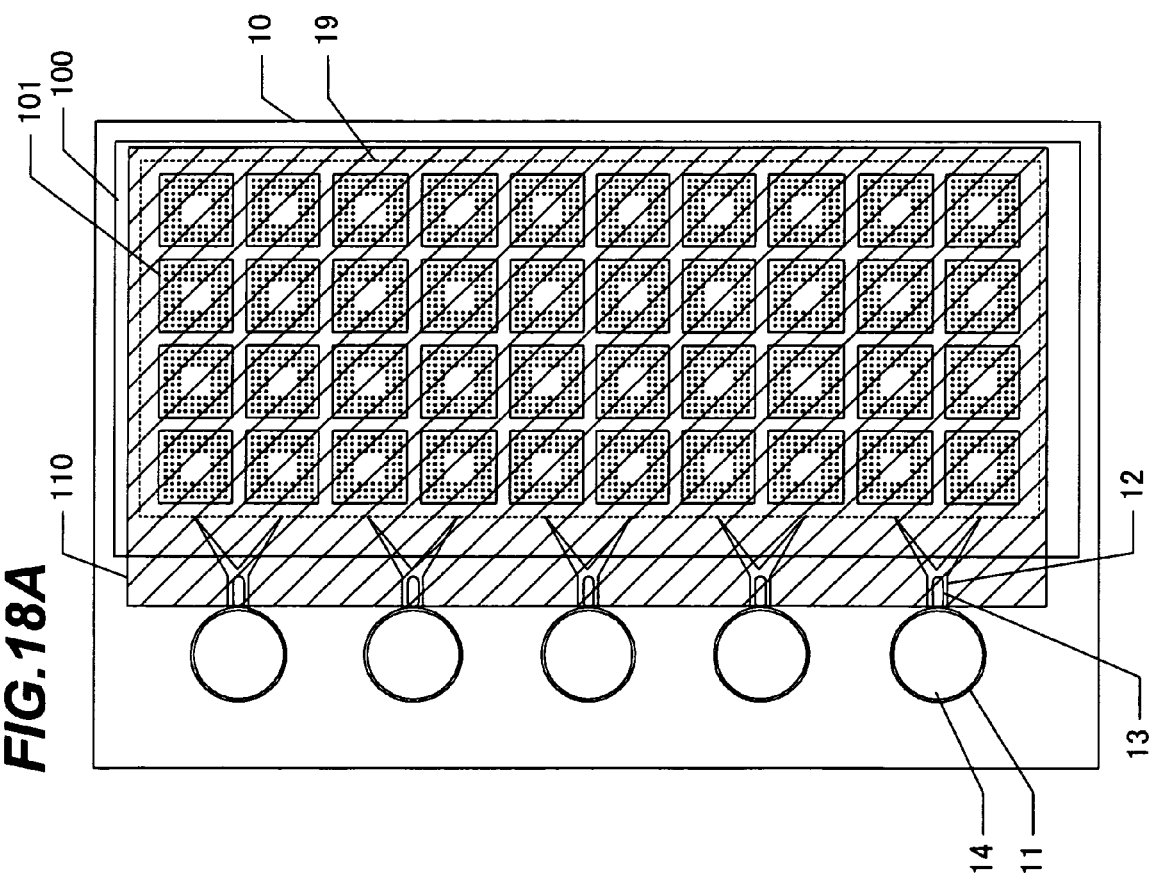

MOLD FOR RESIN MOLDING, RESIN MOLDING APPARATUS, AND SEMICONDUCTOR DEVICE MANUFACTURE METHOD

CROSS REFERENCE TO RELATED APPLICATION

This application is based on and claims priority of Japanese Patent Application No. 2006-094703 filed on Mar. 30, 2006, the entire contents of which are incorporated herein by reference.

BACKGROUND OF THE INVENTION

A) Field of the Invention

The present invention relates to a mold for resin molding, a resin molding apparatus and a semiconductor device manufacture method, and more particularly to a mold and a resin molding apparatus for resin-molding a semiconductor element, and a semiconductor device manufacture method.

B) Description of the Related Art

There are many types of semiconductor packages, such as a quad flat package (QFP) type using a metal lead frame, a small outline package (SOP) type, a ball grid array (BGA) type using a printed circuit board, a system in package (SIP) type electrically connecting semiconductor elements (semiconductor chips).

These semiconductor packages are generally molded with thermosetting resin after lead wires are connected, in order to improve impact resistance, contamination resistance and the like.

As molding resin, main resin agent such as epoxy resin is used which contains curing agent, filler such as melted silica, catalyst, coloring agent and fire retarding agent, at a proper mixture ratio considering a package shape, heat resistance, molding property and the like.

If metallic foreign matters are contained in molding resin, these metallic foreign matters may contact bonding wires, with which a semiconductor chip and a lead frame are connected, to short-circuit bonding wires.

JP-B-HEI-6-53369 discloses the technique of burying a magnet in a mold for resin molding and making the magnet attract metallic foreign matters mixed in resin to remove them. JP-A-2002-313824 discloses the technique of supplying liquid resin on a substrate and disposing a magnet above the substrate to attract foreign matters mixed in the liquid resin.

SUMMARY OF THE INVENTION

From the viewpoint of environment conservation, bonding material not containing lead such as Sn—Ag—Cu based paste is widely used in recent years in place of conventional solder which contains lead. Many bonding materials not containing lead have a higher melting point than that of bonding material containing lead. High heat resistance of a semiconductor package is therefore desired.

One solving method for this is a method of raising a heat resistance temperature of thermosetting resin. Specifically, the amount of filler contained in resin is increased so that molding resin can be manufactured which has a low moisture absorption ratio, a high elastic modulus and a low thermal expansion coefficient. However, as the amount of filler is increased, metallic foreign matters such as chips of a metallic grinder blade are likely to be mixed in resin during a process of pulverizing the resin. Although metallic foreign matters in resin are removed by using a magnet during a resin manufacture process, it is difficult to remove all metallic foreign matters.

Recent requirements for high functionality and high integration of semiconductor elements (semiconductor chips) are increasing further, and a pitch (pad pitch) between electrode pads is becoming narrower. Mass production is now under operation for semiconductor chips having a pad pitch of, e.g., 50 µm or narrower.

As the pad pitch becomes narrower, a diameter of a bonding wire or a size of a solder bump becomes smaller correspondingly.

As the pad pitch becomes narrow, metallic foreign matters contained in molding resin are likely to contact conductive members such as bonding wires and solder bumps, resulting in electric short circuits. A semiconductor device particularly of a SIP type requiring high functionality has an increased number of electric connection points more than a conventional semiconductor device, resulting in a large possibility of an electric short circuit.

Conventionally proposed methods of removing metallic foreign matters mixed in molding resin are insufficient to remove the metallic foreign matters. Resin molding techniques have been desired which suppress electric short circuits to be caused by metallic foreign matters.

An object of the present invention is to provide resin molding techniques capable of suppressing electric short circuits to be caused by metallic foreign matters mixed in molding resin.

According to one aspect of the present invention, there is provided a mold for resin molding comprising:

a mold comprising a pot for accommodating resin, a cavity for accommodating a semiconductor chip to be resin-molded and a runner as a resin passage for transporting the resin accommodated in the pot to the cavity;

a foreign matter retention pocket consisting of a recess formed by digging further a partial inner surface of the runner; and a runner magnet for attracting and attaching a metallic foreign matter contained in fluid transported through the runner to the inner surface of the foreign matter retention pocket.

According to another aspect of the present invention, there is provided a resin molding apparatus comprising:

a platen for placing thereon a mold and heating the mold, the mold comprising a pot for accommodating resin, a cavity for accommodating a semiconductor chip to be resin-molded and a runner as a resin passage for transporting the resin accommodated in the pot to the cavity;

a plunger for applying a pressure to the resin accommodated in the pot in the state that the mold is placed on the platen to inject the resin into the cavity; and a plunger magnet disposed in the plunger for attracting and attaching a metallic foreign matter in liquid resin accommodated in the pot.

While molding resin is melted in the pot, metallic foreign matters mixed in the resin are attracted to the plunger magnet and attached to the surface of the plunger. Metallic foreign matters are therefore hard to be transported to the cavity. The plunger is used in common for various molding dies so that the magnet is not required to be changed for each mold.

Further, while the melted molding resin flows in the runner, the metallic foreign matters mixed in the resin are attracted to the runner magnet and attached to the surface of the foreign matter retention pocket to be captured. The metallic foreign matters captured by the foreign matters are hard to be swept away by a flow of the resin in the runner. The metallic foreign matters in the resin can therefore be captured efficiently, and transportation of the metallic foreign matters to the cavity is suppressed considerably.

Furthermore, while the molding resin is injected into the cavity of the mold, the metallic foreign matters mixed in the resin are attracted to the magnet of the ejector pin and collected to the resin surface near the ejector pin. The metallic foreign matters can therefore be captured efficiently, and existence of the metallic foreign matters near semiconductor elements and bonding wires is suppressed greatly.

BRIEF DESCRIPTION OF THE DRAWINGS

FIG. 2A is a plan view of a lower mold and FIG. 2B is a bottom view of an upper mold of the resin molding apparatus according to the first embodiment.

FIG. 10 is a cross sectional view of a resin molding apparatus according to a third embodiment.

FIG. 15 is a cross sectional view of a resin molding apparatus according to a seventh embodiment.

FIG. 17A is a plan view of a lower mold and FIG. 17B is a bottom view of an upper mold of a resin molding apparatus according to an eighth embodiment.

FIG. 18A is a plan view of a lower mold and FIG. 18B is a bottom view of an upper mold of a resin molding apparatus according to a ninth embodiment.

DESCRIPTION OF THE PREFERRED EMBODIMENTS

The invention will be described in detail with preferred embodiments.

First Embodiment

Figure 1:
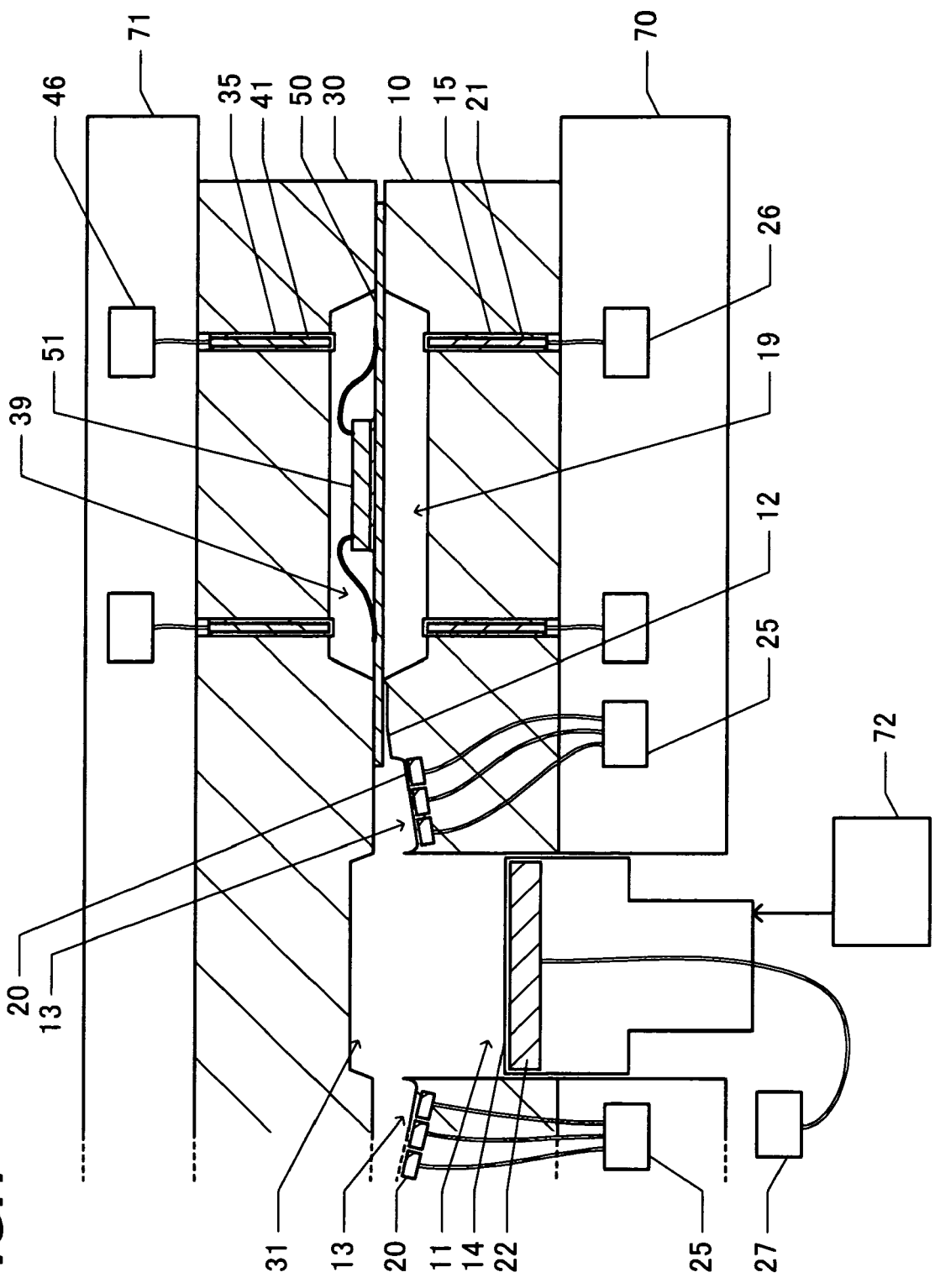
FIG. 1 is a cross sectional view of a resin molding apparatus according to a first embodiment.

FIG. 1 is a partial cross sectional view of a resin molding apparatus and molds according to the first embodiment of the present invention.

As shown in FIG. 1, a lower mold 10 is held by a lower platen 70 and an upper mold 30 is held by an upper platen 71.

Surfaces of the lower mold 10 and upper mold 30 facing each other are called "facing surfaces", and surfaces on the opposite side (planes contacting the platens) are called "back surfaces". The lower platen 70 and upper platen 71 heat the lower mold 10 and upper mold 30, respectively.

A pot 11 is formed through the lower mold 10 from the back surface to the facing surface. A plunger 14 is disposed in the lower platen 70 and can move up and down communicating with the lower mold 10. The plunger 14 can be moved up and down by a drive mechanism 72, and as the plunger is moved up, it is inserted into the pot 11 of the lower mold 10. A recess (cull) 31 is formed in the upper mold 30 in an area facing the pot 11.

Recesses (cavities) 19 and 39 are formed in areas facing each other on the facing surfaces of the lower mold 10 and upper mold 30, respectively. In FIG. 1, although the cavities 19 and 39 are shown disposed to the right of the pot 11, cavities of a similar structure are also disposed to the left of the pot 11. In the state that a lead frame 50 is squeezed between the lower mold 10 and upper mold 30, a semiconductor chip 51 mounted on the lead frame 50 is accommodated in a space defined by the cavities 19 and 39.

A groove (runner) 12 communicating the cavity 19 with the pot 11 is formed on the facing surface of the lower mold 10. Molding resin is accommodated in the pot 11 and melted and the plunger 14 is moved up. Resin in the pot 11 passes through the runner 12 and is injected into the empty space defined by the cavities 19 and 39. In this embodiment, a foreign matter retention pocket 13 is formed deeper on the bottom of the runner 12 at a position near the pot 11.

An ejector pin 15 is inserted into each of through holes formed through the lower mold 10 from the back surface to a bottom of the cavity 19. A plurality of ejector pins 15 are disposed with respect to one cavity 19. A top end of the ejector pin 15 is exposed in the cavity 19. By protruding the ejector pin 15 into the cavity 19, resin cured and adhered to the lower mold 10 can be easily released (demolded) from the lower mold 10. Ejector pins 35 of a similar structure are also disposed in the upper mold 30.

In this embodiment, a magnet (hereinafter called a plunger magnet) is disposed on a surface of the plunger 14 facing the pot 11. The plunger magnet 22 consists of an electromagnet, and exciting current is supplied from a power supply 27. This electromagnet may be exposed in the pot 11 or may be buried at a position slightly deeper than the surface of the plunger 14.

A magnet (hereinafter called a runner magnet) 20 is disposed on the wall surface of the foreign matter retention pocket 13 of the runner 12. The runner magnet 20 includes, for example, three electromagnets disposed along a longitudinal direction of the foreign matter retention pocket 13, and exciting current is supplied from a power supply 25 to each electromagnet. Each electromagnet may be exposed on the surface of the foreign matter retention pocket 13 or may be buried at a position slightly deeper than the surface.

Magnets (hereinafter called ejector pin magnets) 21 and 41 are loaded in the ejector pins 15 of the lower mold 10 and in the ejector pins 35 of the upper mold 30. Each of the ejector pin magnets 21 and 41 consists of an electromagnet, and exciting current is supplied to the ejector pin magnets 21 and 41 from power supplies 26 and 46, respectively.

FIG. 2A shows a plan shape of the lower mold 10. A cross section taken along on-dot chain line A1-A1 shown in FIG. 2A corresponds to the cross sectional view of FIG. 1.

As shown in FIG. 2A, six pots 11 are disposed along a vertical direction at an equal pitch. The plan shape of each of the pots 11 is circular.

The plunger 14 is disposed inside each pot 11. Cavities 19 are disposed on both sides of each pot 11. Each cavity 19 has a plan shape obtained by cutting four corners of a square obliquely or in circular arc shape, and the ejector pins 15 are disposed at positions near four corners.

The runner 12 extends on both sides of the pot 11 along a virtual straight line extending laterally in FIG. 2A and passing through the center of each pot 11. The runner 12 changes its direction intermediately and reaches a position near the corner of the corresponding cavity 19. The runner 12 becomes narrower and shallower toward the cavity 19. The foreign matter retention pocket 13 is disposed in a partial area of the runner 12 near the pot 11.

FIG. 2B shows a bottom shape of the upper mold 30. A cross sectional view taken along one-dot chain line A1-A1 shown in FIG. 2B corresponds to the cross sectional view shown in FIG. 1.

As shown in FIG. 2B, the cull 31 is formed at the position corresponding to the pot 11 of the lower mold 10. The cull 31 has the same plan shape as that of the pot 11.

The cavity 39 is disposed at the position corresponding to the cavity 19 of the lower mold 10. The cavity 39 has the same plan shape as that of the cavity 19 formed on the lower mold 10. The ejector pins 35 are disposed at positions near four corners of the cavity 39.

Figure 3A:
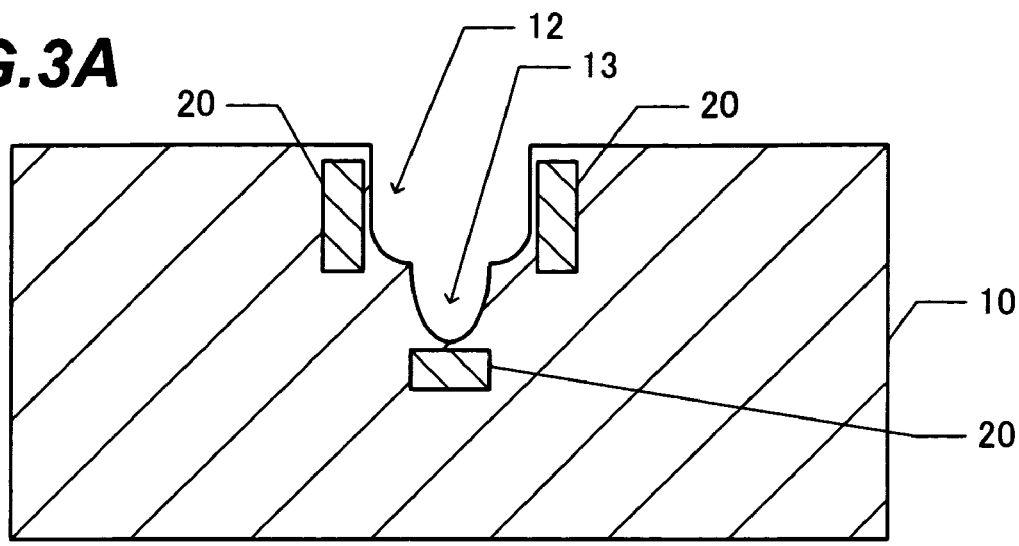
FIG. 3A is a cross sectional view of a runner and a runner magnet disposed in the lower mold of the resin molding apparatus of the first embodiment, this view being perpendicular to the longitudinal direction of the runner.

FIG. 3A shows a cross section perpendicular to the longitudinal direction of the foreign matter retention pocket 13 shown in FIG. 1.

Figure 3B:
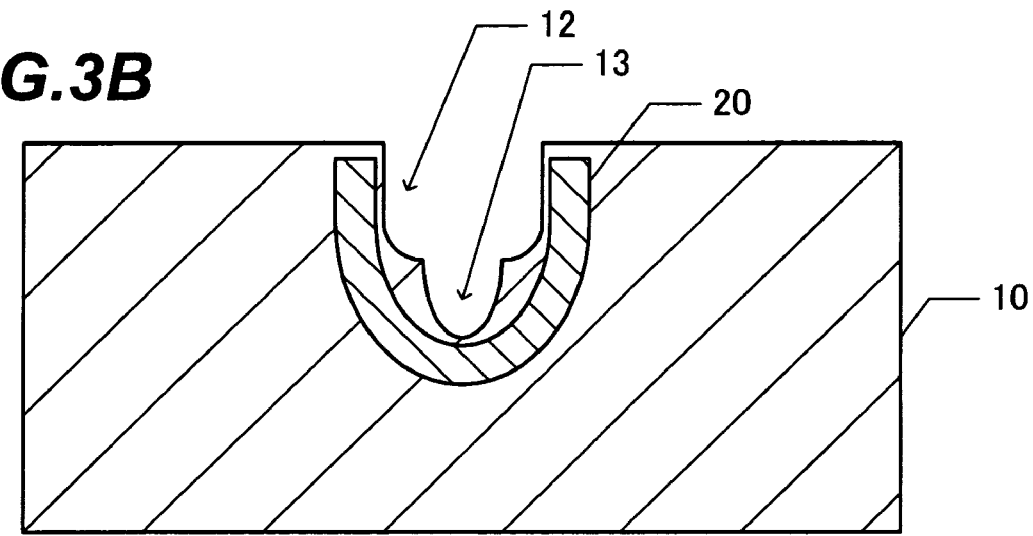
FIG. 3B is a cross sectional view showing an example of another structure.

The runner 12 is formed on the facing surface of the lower mold 10, and the bottom is dug deeper to form the foreign matter retention pocket 13. The runner magnet 20 is buried at the position deeper than the bottom of the foreign matter retention pocket 13. The runner magnets 20 are buried on both sides of the runner 12. As shown in FIG. 3B, the runner magnet 20 may have a U-character cross sectional shape extending along the surface of the runner 12 and foreign matter retention pocket 13.

Figure 3C:
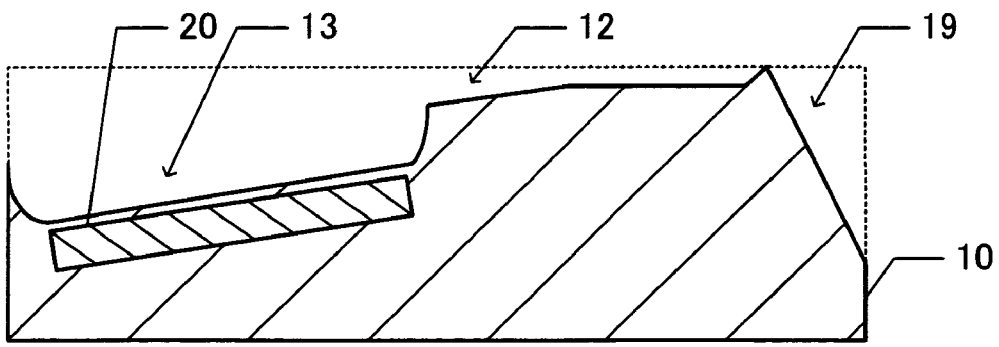
FIG. 3C is a cross sectional view of the runner and runner magnet as viewed along the longitudinal direction.

FIG. 3C shows another example of the structure of the runner magnet 20.

In the structure shown in FIG. 1, the runner magnet 20 includes three electromagnets disposed along the longitudinal direction of the foreign matter retention pocket 13. As shown in FIG. 3C, the runner magnet may be one long electromagnet extending along the longitudinal direction of the foreign matter retention pocket 13.

Figure 4A:
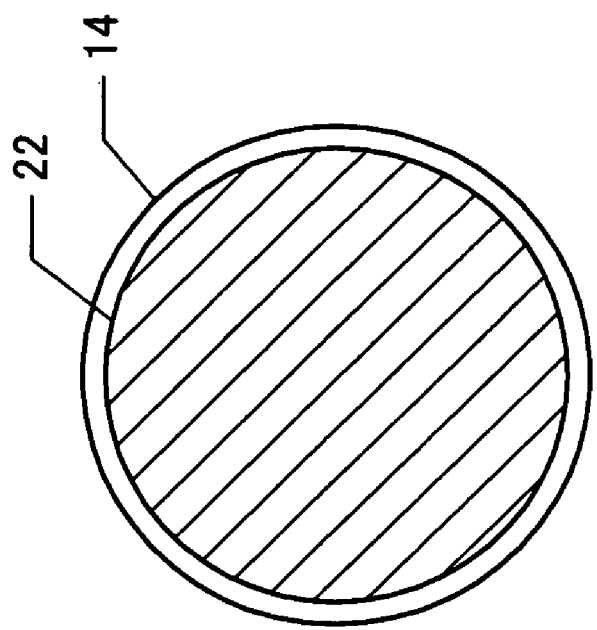
FIG. 4A is a cross sectional plan view of a plunger of the resin molding apparatus of the first embodiment.

FIG. 4A shows a cross sectional plan view of the plunger 14.

The plunger magnet 22 is disposed in the plunger 14 having a circular plan shape. The plunger magnet 22 has a circular plan shape having an outer circumferential line at a position slightly inside the outer circumference of the plunger 14.

Figure 4B:
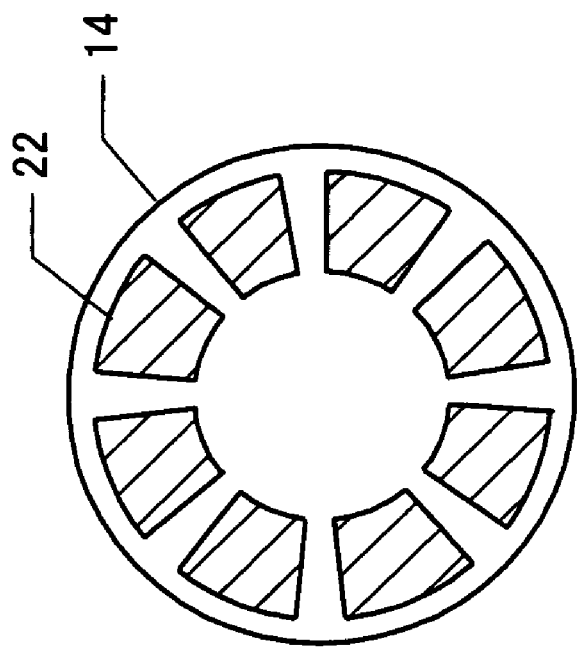
FIG. 4B is a cross sectional plan view showing an example of another structure.

FIG. 4B shows an example of the other structure of the plunger magnet 22. The plunger magnet 22 shown in FIG. 4B has a shape that a cylindrical member having the central axis shared by the plunger 14 is cut by a plurality of virtual flat planes passing through the central axis. The cylindrical member is divided in eight-fold rotation symmetry with respect to the central axis.

Next, with reference to FIGS. 5 to 8, description will be made on a resin molding method using the resin molding apparatus of the first embodiment.

Figure 5:
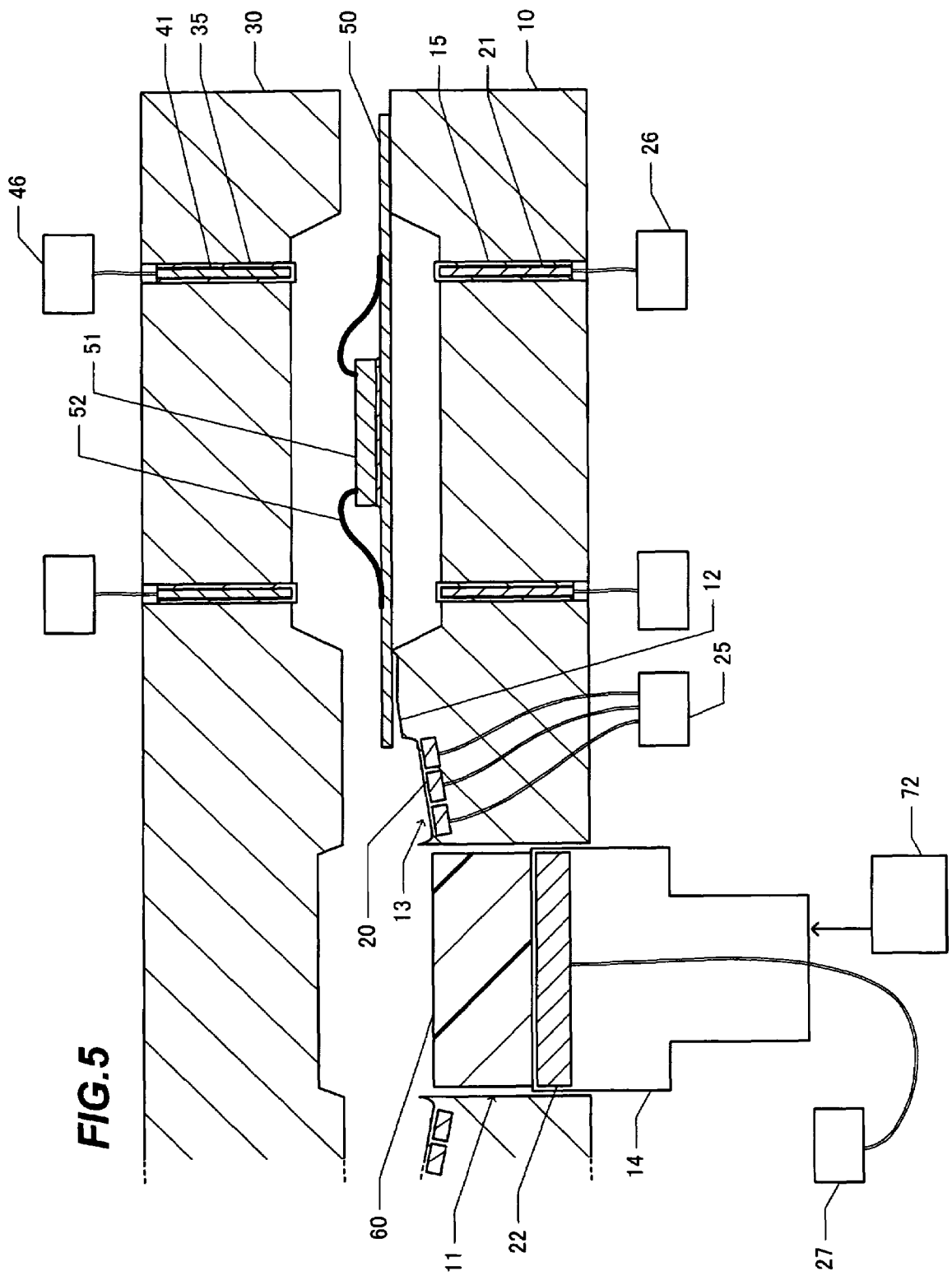
FIGS. 5 to 8 are cross sectional views of the resin molding apparatus of the first embodiment illustrating a resin molding procedure.

As shown in FIG. 5, in the state that the distance between the lower mold 10 and upper mold 30 is elongated, the lead frame 50 mounting the semiconductor chip 51 as a molding target is placed on the facing surface of the lower mold 10. Electrodes of the semiconductor chip 51 are connected to corresponding lead portions by bonding wires 52.

A solid piece 60 of molding resin is loaded in the pot 11. At this stage, the power supply 25 for the runner magnet 20, the power supplies 26 and 46 for the ejector magnets 21 and 41 and the power supply 27 for the plunger magnet 22 are all in an off-state.

Figure 6:
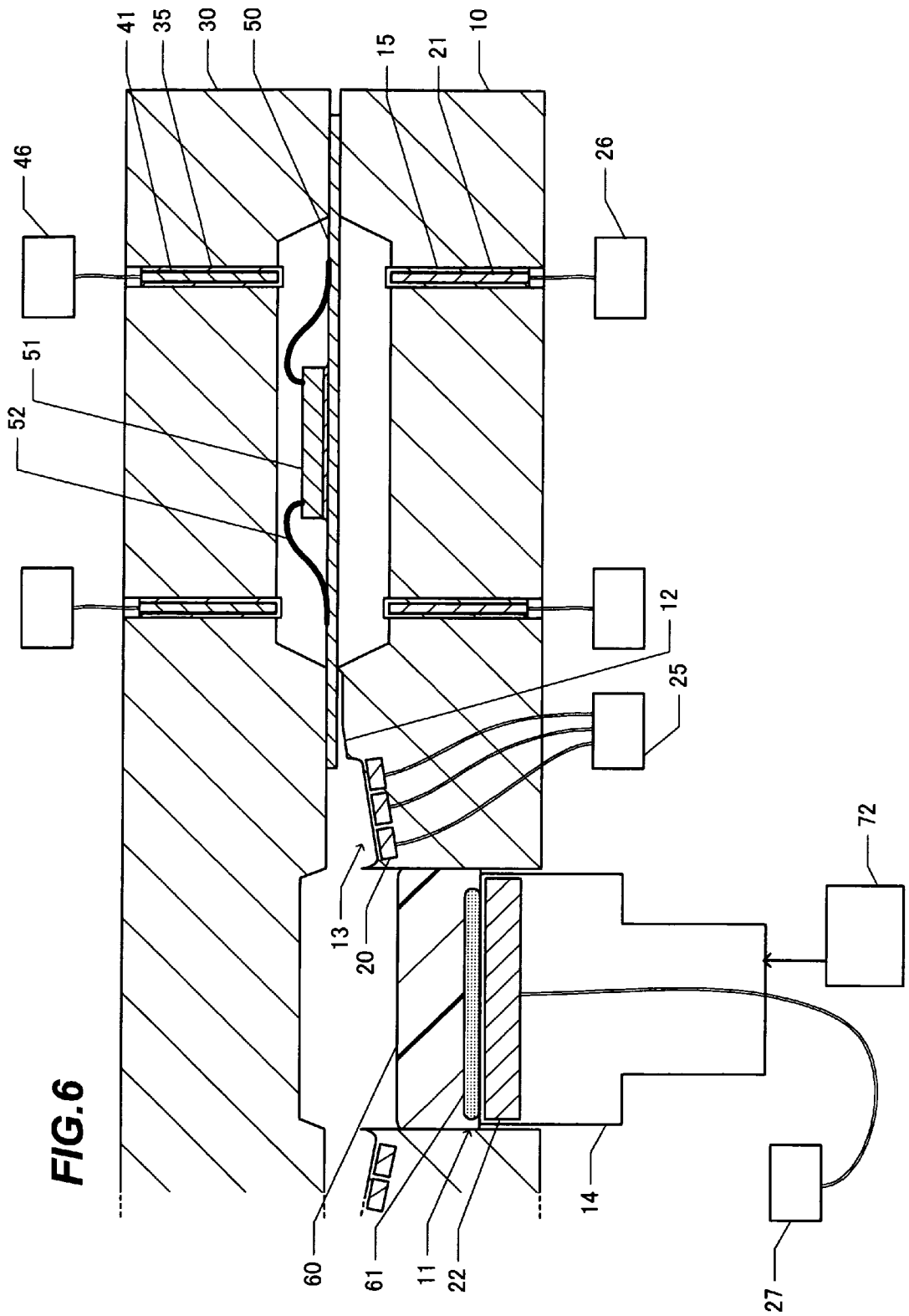

Next, as shown in FIG. 6, the upper mold 30 is moved down to squeeze the lead frame 50 between the lower mold 10 and upper mold 30.

Thereafter, the lower mold 10 and upper mold 30 are heated to melt the resin 60 loaded in the pot 11. After the resin 60 is loaded, e.g., at the same time when heating starts, the power supply 27 for the plunger magnet 22 is turned on to excite the plunger magnet 22.

Upon excitation of the plunger magnet 22, metallic foreign matters already mixed in the melted resin 60, particularly, metallic powders and fine particles of iron (Fe) and its alloy capable of being magnetized, are attracted to the plunger magnet 22 and collected in a region of the melted resin 60 near the upper surface of the plunger 14. A high density region 61 of the metallic foreign matters is therefore generated.

A density of foreign matters in the other region of the melted resin 60 is therefore lowered.

Figure 7:
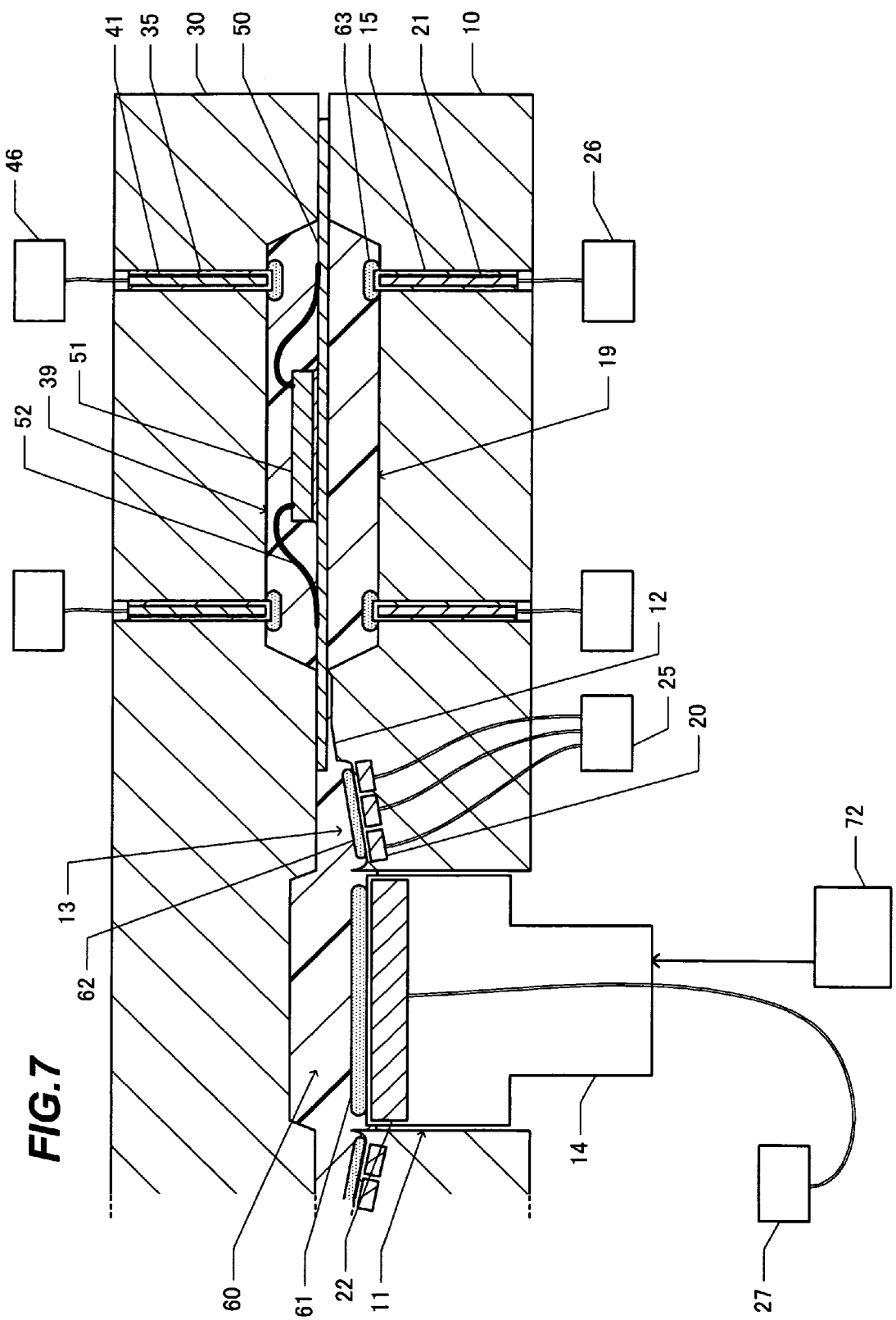

As shown in FIG. 7, after the resin 60 is melted, the plunger 14 is moved up to inject the resin 60 loaded in the pot 11 into the cavities 19 and 39 via the runner 12. At this stage, the power supply 25 for the runner magnet 20 and the power supplies 26 and 46 for the ejector pin magnets 21 and 41 are turned on.

Upon excitation of the runner magnet 20, while the resin 60 passes in the runner 12, metallic foreign matters mixed in the resin 60 are attracted to the runner magnet 20 and are brought in the foreign matter retention pocket 13. A high density region 62 of metallic foreign matters is therefore generated in the foreign matter retention pocket 13. As described above, the foreign matter retention pocket 13 is dug deeper than the sidewall of the runner 12. Therefore, metallic foreign matters brought in the foreign matter retention pocket 13 stay in the foreign matter retention pocket 13 without being swept away by a flow of resin in the runner 12.

The resin 60 passing through the runner 12 and injected into the cavities 19 and 39 fills the cavities 19 and 39 to resin-mold the semiconductor chip 51, the bonding wires 52 and a part of the lead frame 50.

At this stage, metallic foreign matters mixed in the resin 60 are attracted to the top ends of the ejector pins 15 and 35 to generate high density regions 63 of metallic foreign matters near the top ends. The high density region 63 of metallic foreign matters is positioned near the surface of the resin and remote from the semiconductor chip 51, bonding wires 52 and the like so that a possibility of contact with these conductive members is very low.

After the cavities 19 and 39 are completely filled with resin 60, heat is applied to the resin 60 for a predetermined time to cure the resin 60.

After the resin 60 is cured, the power supplies 25 to 27 and 46 are turned off to terminate excitation of the runner magnet 20, ejector pin magnets 21 and 41 and plunger magnet 22.

Figure 8:
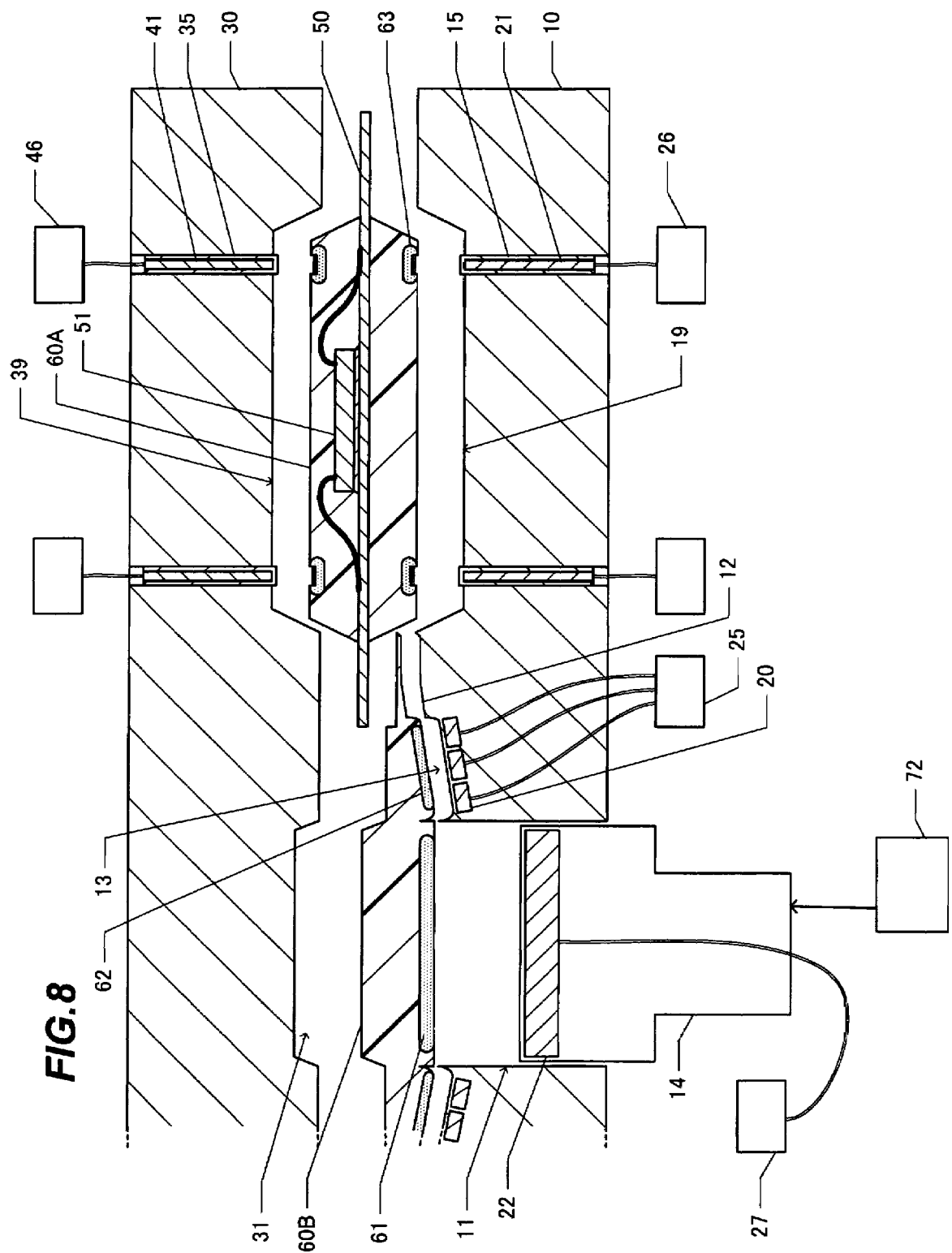

As shown in FIG. 8, after the resin is cured, the upper mold 30 is detached from the lower mold 10 and the ejector pins 15 and 35 are protruded to thereby demold the lead frame 50 including the semiconductor device molded by cured resin 60A.

Resin 60B left in the pot 11, cull 31 and runner 12 is removed from the lower mold 10 and upper mold 30.

In this manner, the high density region 60 concentrating metallic foreign matters mixed in the resin 60 is generated near the upper surface of the plunger 14 in the process shown in FIG. 6, and the high density region 62 concentrating metallic foreign matters is generated in the foreign matter retention pocket 13 of the runner 12 in the process shown in FIG. 7.

It is therefore possible to considerably reduce the amount of metallic foreign matters reaching the cavities 19 and 39.

The high density regions 63 concentrating metallic foreign matters transported to top end portions of the ejector pins 15 and 35 are also generated in the cavities 19 and 39.

It is therefore possible to lower a density of metallic foreign matters in resin near the lead frame 50, semiconductor chip 51 and bonding wires 52 interconnecting the lead frame 50 and semiconductor chip 51. Therefore, it is possible to prevent and suppress generation of electric short circuits among the bonding wires 52.

In order to efficiently capture metallic foreign matters, it is preferable to set a magnetic force of each of the runner magnet 20, ejector pin magnets 21 and 41 and plunger magnet 22 to 10000 gausses or higher.

The plunger magnet 22 is excited only while the resin 60 in the pot 11 is melted. The runner magnet 20 is excited only while the resin 60 flows in the runner 12. The ejector pin magnets 21 and 41 are excited only while the resin 60 in the cavities 19 and 39 is melted.

A power consumption can be suppressed by selecting an excitation period in this manner.

In the first embodiment described above, advantages may be expected to some extent even if one of the runner magnet 20, ejector magnets 21 and 41 and plunger magnet 22 is disposed.

Since the plunger 14 is disposed in the lower platen 70, advantages of the magnet can be expected for various types of molds without placing the magnet in each mold.

The ejector pin magnets 21 and 41 can be mounted by replacing them with other ejector pins with magnets, without machining the lower mold 10 and upper mold 30. Therefore, magnets can be mounted easily on conventional molds. If the size of the ejector pin is standardized, the same ejector pin can be used for various types of molds.

Second Embodiment

Figure 9:
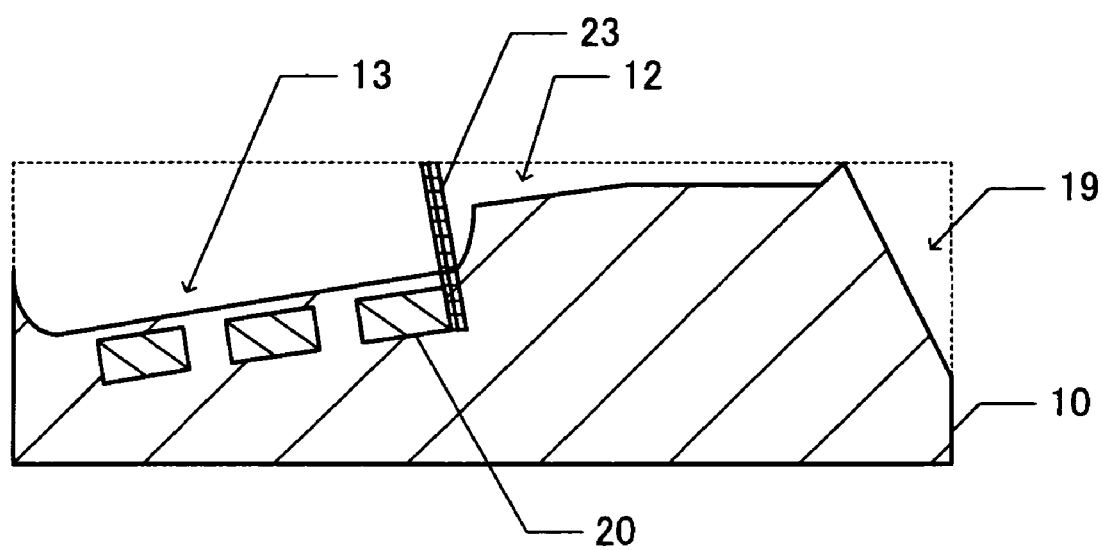
FIG. 9 is a cross sectional view showing a characteristic portion of a resin molding apparatus according to a second embodiment.

FIG. 9 is a cross sectional view of a characteristic portion of a resin molding apparatus according to the second embodiment of the present invention.

Description will be made by paying attention to different points from the resin molding apparatus of the first embodiment, and the description of the components having the same structure is omitted.

In this embodiment, a meshed member 23 made of magnetic material is disposed perpendicularly to a flow direction of resin in the runner 12.

Resin flowing in the runner 12 passes through openings of the meshed member 23. The meshed member 23 is magnetically coupled to the runner magnet 20. As the runner magnet 20 is excited, the meshed member 23 is magnetized.

As the meshed member 23 is magnetized, metallic foreign matters mixed in resin can be attracted and attached to the meshed member 23 efficiently. Especially, it is possible to efficiently attach metallic foreign matters flowing in a region remote from the surface of the runner 12.

Third Embodiment

FIG. 10 is a cross sectional view of a resin molding apparatus according to the third embodiment of the present invention.

Description will be made by paying attention to different points from the resin molding apparatus of the first embodiment, and the description of the components having the same structure is omitted.

In the first embodiment described above, the ejector pin magnets 21 and 41 are disposed in the ejector pins 15 and 35, respectively.

In the third embodiment, ejector pins 15 and 35 are made of magnetic material such as iron. The ends of two ejector pins 15 on the back side are coupled with each other by an ejector pin magnet 80. The ejector pin magnet 80 consists of an electromagnet, and excitation current is supplied from a power supply 82 to the ejector pin magnet 80.

Similarly, ejector pin magnets 81 and a power supply 83 are disposed for ejector pins 35 of the upper mold 30.

As the ejector pin magnets 80 and 81 are excited, the ejector pins 15 and 35 are magnetized. Therefore, metallic foreign matters can be attracted and attached to the top ends of the ejector pins 15 and 35 exposed in the cavities 19 and 39.

In the structure shown in FIG. 10, although one ejector pin magnet is magnetically coupled to a plurality of ejector pins, an independent ejector pin magnet may be disposed for each ejector pin.

Fourth Embodiment

Figure 11A:
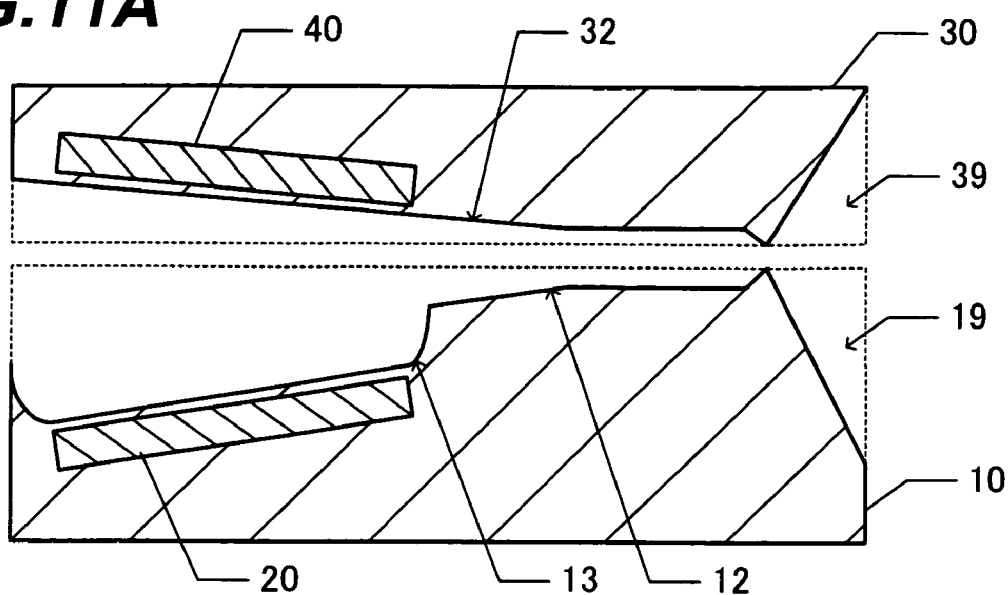
FIGS. 11A and 11B are cross sectional views showing characteristic portions of a resin molding apparatus according to a fourth embodiment.
Figure 11B:
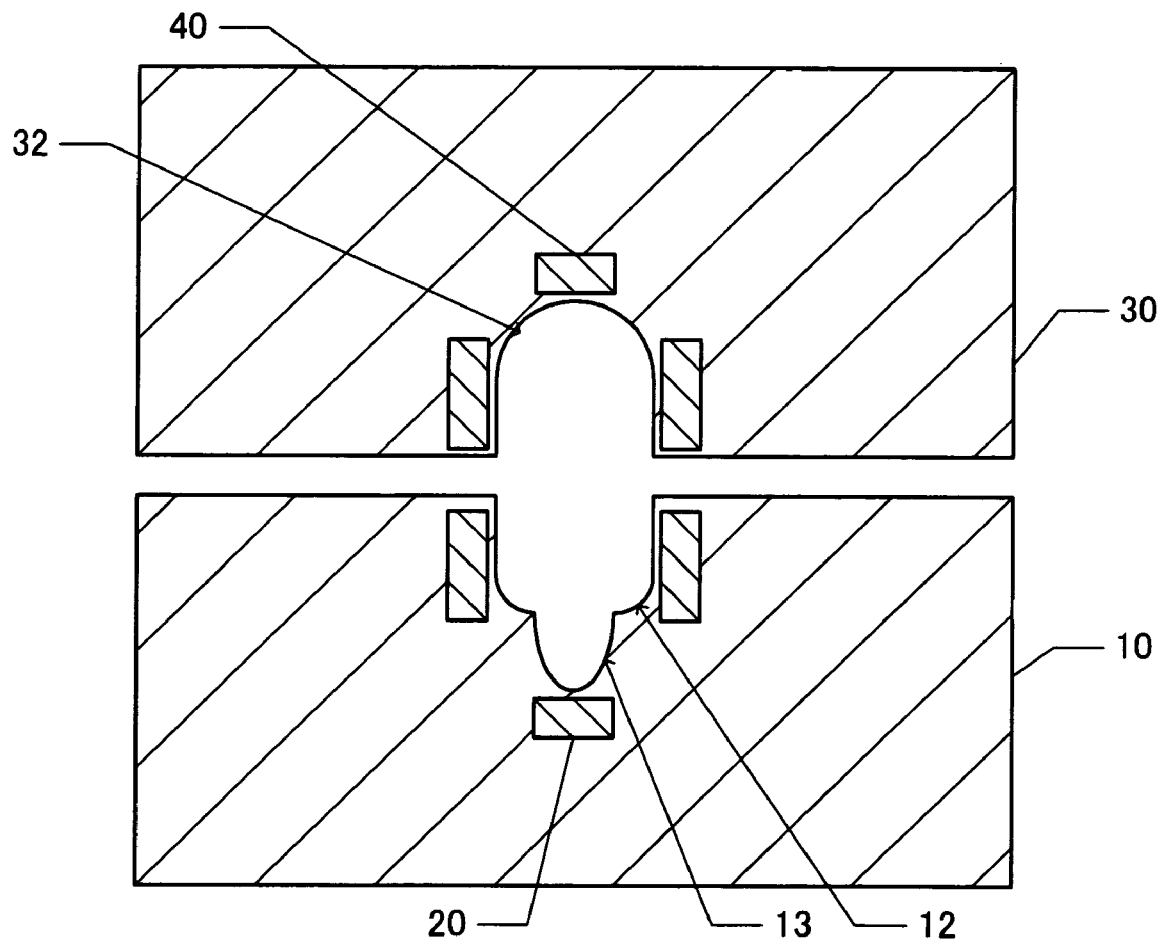

FIGS. 11A and 11B are cross sectional views showing a characteristic portion of a resin molding apparatus according to the fourth embodiment of the present invention.

Description will be made by paying attention to different points from the resin molding apparatus of the first embodiment, and the description of the components having the same structure is omitted.

FIG. 11A is a cross sectional view of the resin molding apparatus along the longitudinal direction of a runner 12 according to the fourth embodiment, and FIG. 11B is a cross sectional view thereof along a direction perpendicular to the longitudinal direction of the runner 12.

In the first embodiment, although the runner 12 is disposed only in the lower mold 10, in the fourth embodiment, a runner 32 is also formed in the upper mold 30. The runner 32 formed in the upper mold 30 is disposed at the position facing the runner 12 formed in the lower mold 10.

The runner 32 becomes shallower toward the cavity 39. Runner magnets 40 are buried at a position slightly deeper than the both side surfaces and bottom surface of the runner 32. The runner magnet 40 has an elongated shape along the longitudinal direction of the runner 32. Each runner magnet 40 consists of an electromagnet, similar to the runner magnets 20 buried in the lower mold 10.

With this arrangement, metallic foreign matters mixed in resin flowing in the runner 32 formed in the upper mold 30 can be attracted and attached to the sidewall of the runner 32 by the runner magnets 40. It is therefore possible to enhance the advantages of preventing and suppressing metallic foreign matters from entering the cavities 19 and 39.

Figure 12A:
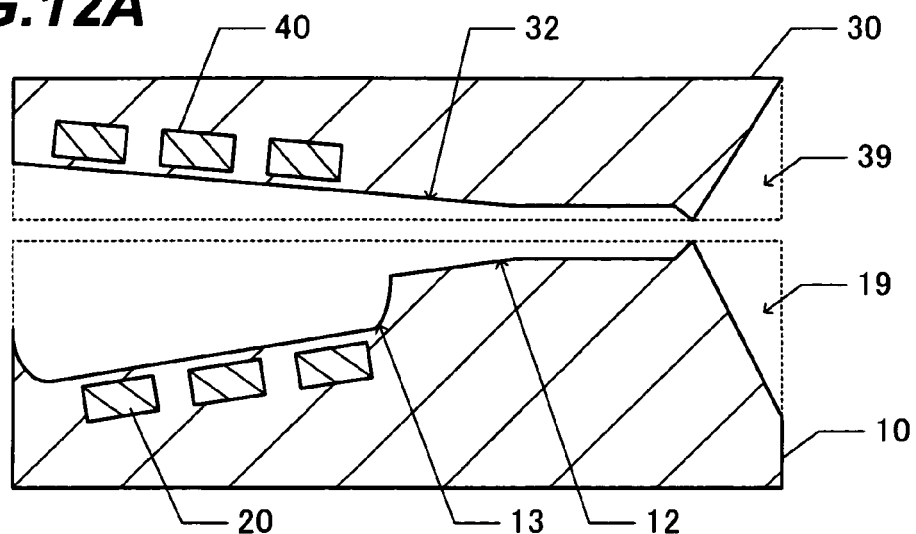
FIGS. 12A and 12B are cross sectional views showing an example of another structure of characteristic portions of the resin molding apparatus according to the fourth embodiment.
Figure 12B:
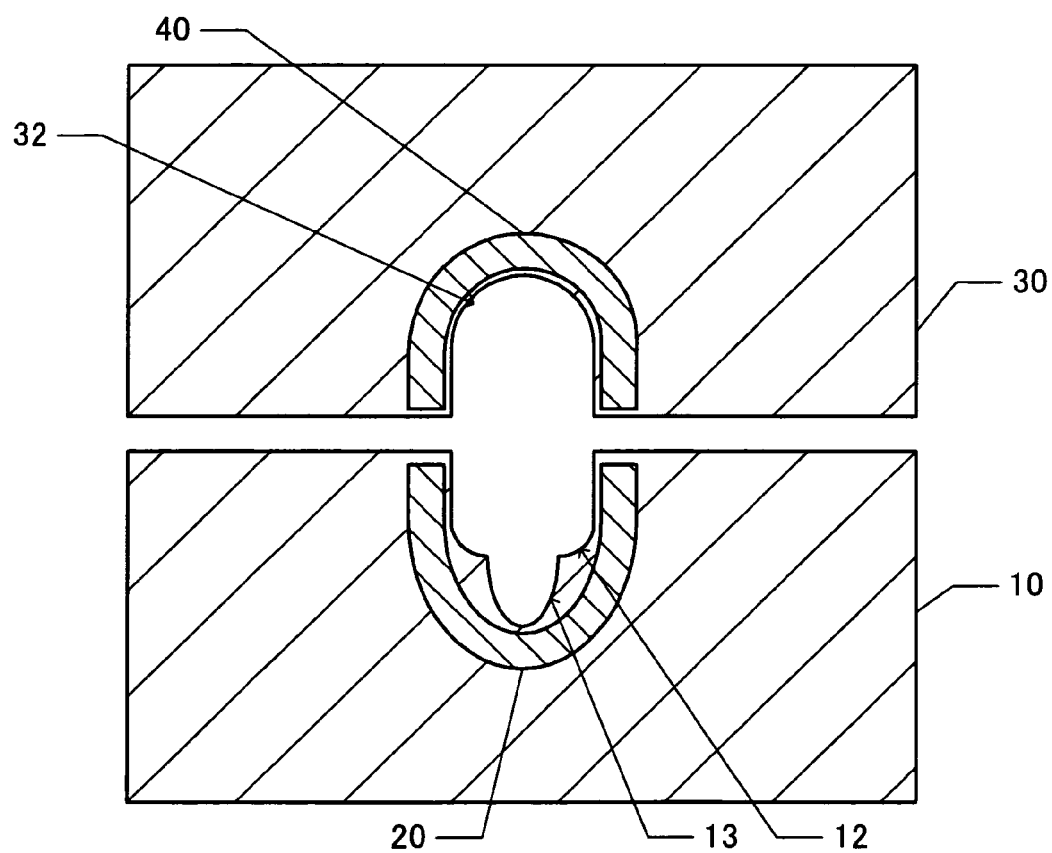

As shown in FIG. 12A, a plurality of runner magnets 40, e.g., three magnets, may be divisionally disposed along the longitudinal direction of the runner 32. Alternatively, as shown in FIG. 11B, a cross sectional shape of the runner magnet 40 may be a U-character shape extending along the surface of the runner 32.

Fifth Embodiment

Next, with reference to FIGS. 13A and 13B, description will be made on a resin molding apparatus according to the fifth embodiment of the present invention. The description will be made by paying attention to different points from the resin molding apparatus of the first embodiment, and the description of the components having the same structure is omitted.

Figure 13B:
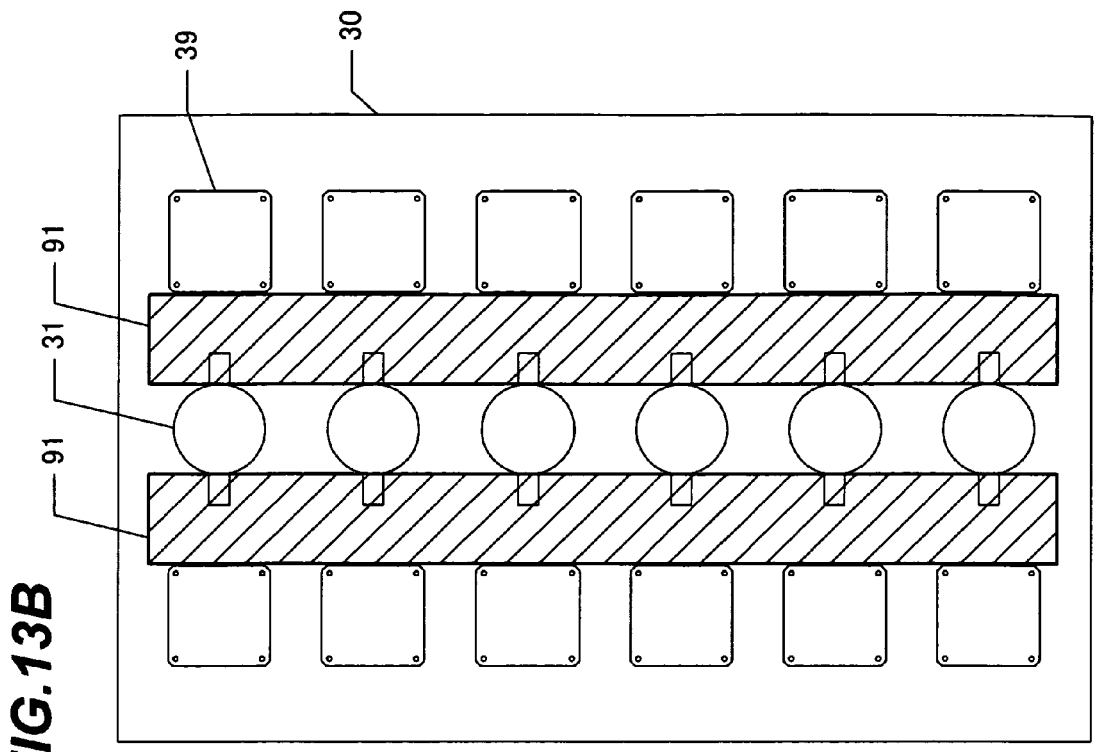
FIG. 13A is a plan view of a lower mold and FIG. 13B is a bottom view of an upper mold of a resin molding apparatus according to a fifth embodiment.
Figure 13A:
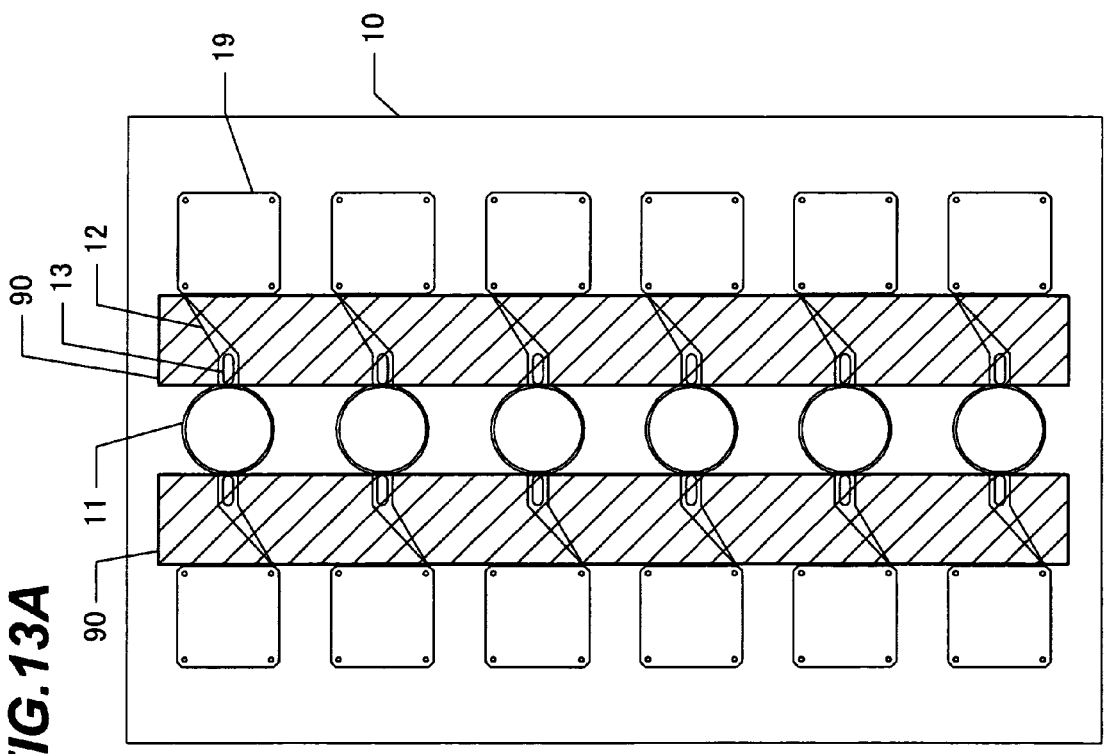

FIG. 13A shows a plan shape of the lower mold 10 of the resin molding apparatus of the fifth embodiment.

In the first embodiment, the runner magnet is disposed for each of a plurality of runners 12.

In the fifth embodiment, a runner magnet 90 is disposed overlapping with a plurality of runners 12.

FIG. 13B shows a shape of the facing surface, facing the lower mold, of the upper mold 30 of the resin molding apparatus of the fifth embodiment.

A runner magnet 91 is disposed in an area corresponding to the runner magnet 90 disposed in the lower mold 10.

Similar to the first embodiment, also with the arrangement of the fifth embodiment, metallic foreign matters can be attracted and attached in the foreign matter retention pocket 13 of the runner 12.

Sixth Embodiment

Figure 14B:
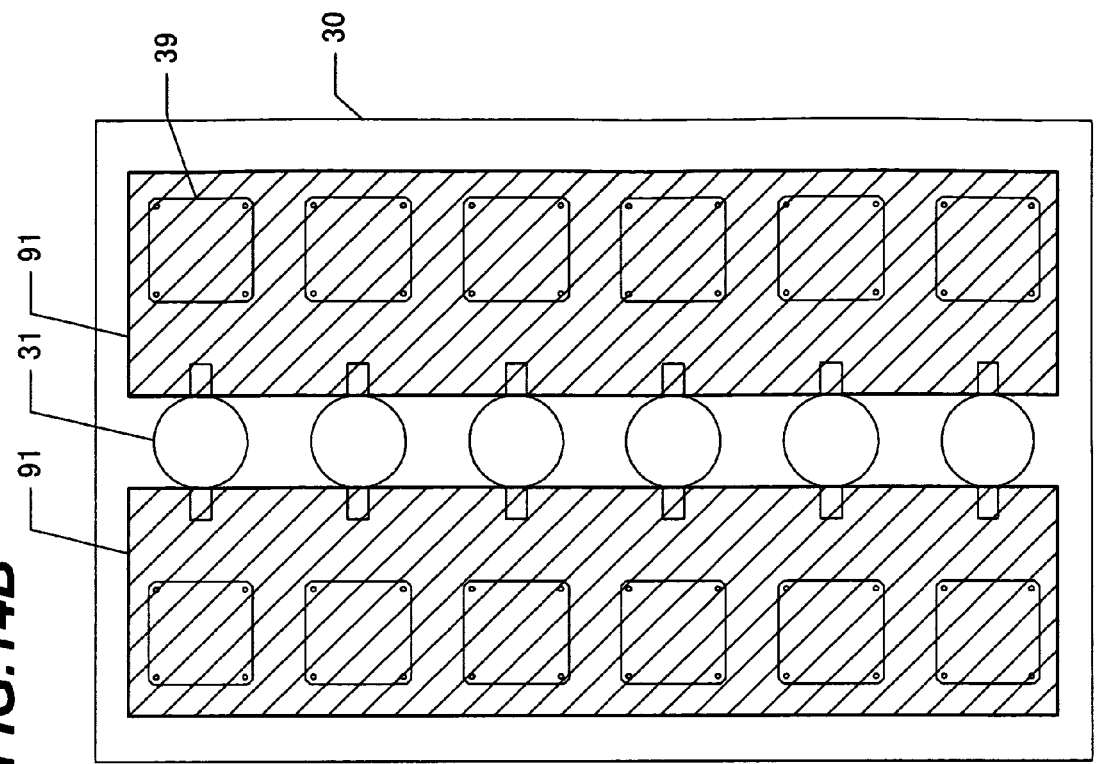
FIG. 14A is a plan view of a lower mold and FIG. 14B is a bottom view of an upper mold of a resin molding apparatus according to a sixth embodiment.

Next, with reference to FIGS. 14A and 14B, description will be made on a resin molding apparatus according to the sixth embodiment of the present invention.

Figure 14A:
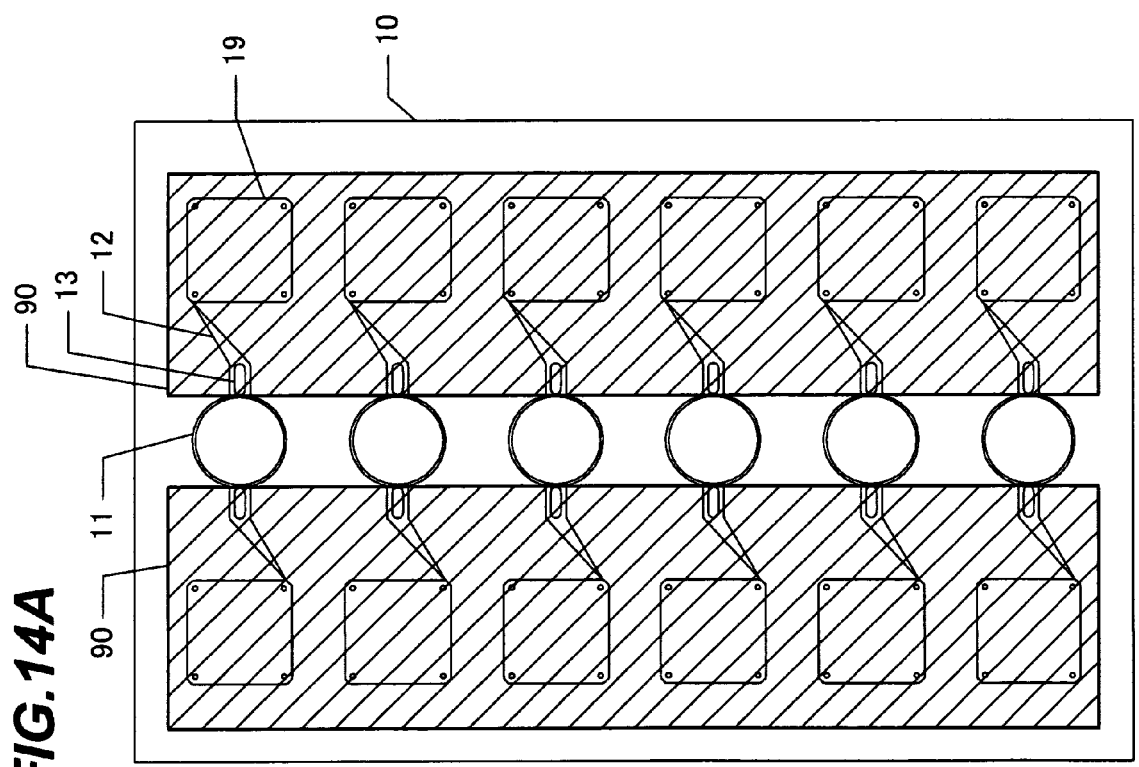

As shown in FIG. 14A, an area occupied by the runner magnet 90 shown in FIG. 13A is broadened to make the runner magnet 90 be disposed also overlapping with the cavity 19. As shown in FIG. 14B, an area occupied by the runner magnet 91 shown in FIG. 13B is broadened to make the runner magnet 91 be disposed also overlapping with the cavity 39.

In the sixth embodiment, metallic foreign matters can be attracted and attached also to the inner surfaces of the cavities 19 and 39.

Seventh Embodiment

Next, with reference to FIGS. 15 to 16B, description will be made on a resin molding apparatus according to the seventh embodiment. The description will be made by paying attention to different points from the resin molding apparatus of the first embodiment, and the description of the components having the same structure is omitted.

FIG. 15 is a cross sectional view of the resin molding apparatus of the seventh embodiment.

In the first embodiment, a semiconductor chip mounted on a lead frame is molded being covered with resin on both sides thereof.

In the seventh embodiment, a resin molding target is a BGA type package and semiconductor chips mounted on one principal surface of a support substrate 100 are molded with resin on the support substrate 100.

As shown in FIG. 15, a plurality of semiconductor chips 101 are mounted on one principal surface of the support substrate 100, and electrodes of the semiconductor chips 101 are connected to electrodes formed on the support substrate 101 by bonding wires.

A substrate housing recess 39A is formed in the upper mold 30, the recess 39A having a shape and depth generally equal to the shape and thickness of the support substrate 100.

The cavity 19 formed in the lower mold 10 has an area covering the semiconductor chips together.

The support substrate 100 is held on the facing surface of the lower mold 10 in such a manner that the surface of the support substrate 100, on which the semiconductor chips 101 are mounted, faces the lower mold 10. All the semiconductor chips 101 are accommodated in one cavity 19. The inner surface of the substrate housing recess 39A formed in the upper mold 30 becomes in contact with the surface of the support substrate 100 opposite to the surface on which the semiconductor chips 101 are mounted.

Figure 16B:
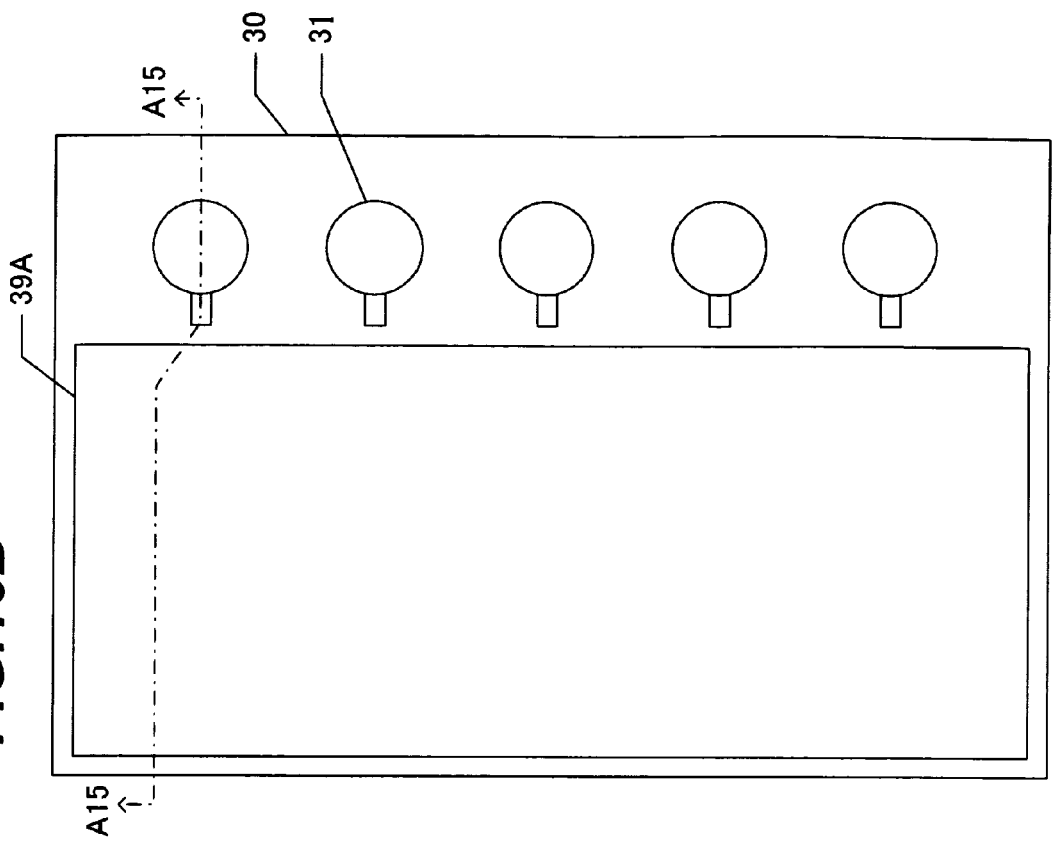
FIG. 16A is a plan view of a lower mold and FIG. 16B is a bottom view of an upper mold of the resin molding apparatus according to the seventh embodiment.
Figure 16A:
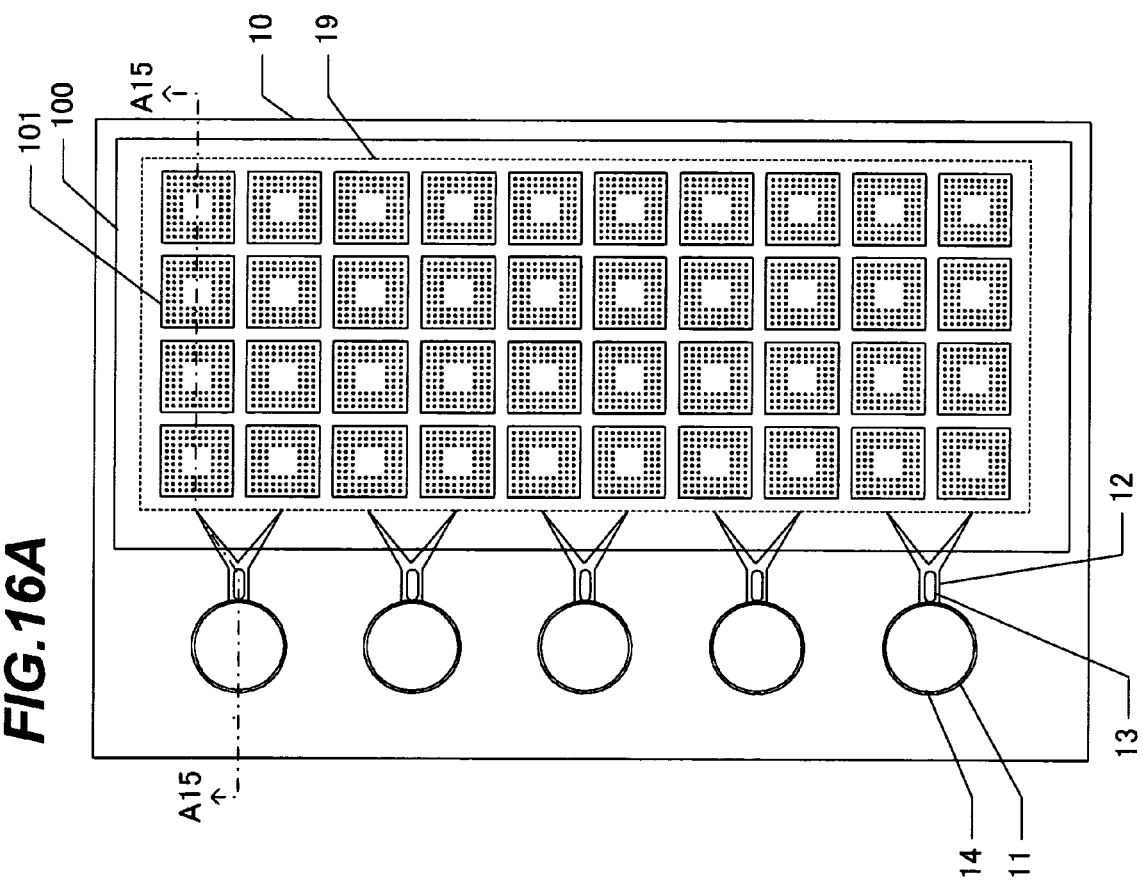

FIGS. 16A and 16B show a plan shape of the lower mold 10 and a shape of the facing surface of the upper mold 30 facing the lower mold, respectively of the resin molding apparatus of the seventh embodiment. A cross sectional view taken along one-dot chain lines in FIGS. 16A and 16B corresponds to FIG. 15.

As shown in FIG. 16A, five pots 11 are disposed along a vertical direction at an equal pitch. A plan shape of each pot 11 is circular.

A plunger 14 is disposed in each pot 11. A rectangular cavity 19 is disposed on the right of each pot 11. A runner 12 extends from each pot 11 toward the right side and branches intermediately into two runners which reach the cavity 19.

A foreign matter retention pocket 13 is formed in the runner 12 in a partial area thereof near the pot 11. A runner magnet 20 is disposed in correspondence with each foreign matter retention pocket 13.

As shown in FIG. 16B, a cull 31 is disposed in the upper mold 30 at a position corresponding to the pot 11. A substrate housing recess 39A having a plan shape larger than that of the cavity 19 is disposed in an area corresponding to the cavity 19. A plan shape of the substrate housing recess 39A is generally equal to the plan shape of the support substrate 100.

Also in resin molding for a BGA type package as in the seventh embodiment, the runner magnet 20 is disposed under the foreign matter retention pocket 13 formed in the runner 12 so that invasion of metallic foreign matters into the cavity 19 can be suppressed.

By disposing the plunger magnet 22 in the plunger 14, invasion of metallic foreign matters can be suppressed further.

Eighth Embodiment

FIGS. 17A and 17B show a plan shape of the lower mold 10 and a shape of the facing surface of the upper mold 30 relative to the lower mold, respectively of a resin molding apparatus of the eighth embodiment.

The description will be made by paying attention to different points from the resin molding apparatus of the seventh embodiment, and the description of the components having the same structure is omitted.

As shown in FIG. 17A, in the eighth embodiment, one magnet 110 is disposed instead of the runner magnets 20 of the seventh embodiment. The magnet 110 is disposed overlapping with all runners 12 extending from a plurality of pots 11, namely covers all runners together.

As shown in FIG. 17B, a magnet 111 is disposed for the upper mold 30 in an area corresponding to the magnet 110 of the lower mold.

Also in the eighth embodiment, similar to the seventh embodiment, metallic foreign matters can be attracted to the foreign matter retention pocket 13 of the runner 12.

Ninth Embodiment

FIGS. 18A and 18B show a plan view of the lower mold 10 and the facing surface of the upper mold 30 facing the lower mold, respectively of a resin molding apparatus according to the ninth embodiment of the present invention.

In the ninth embodiment, the area occupied by the magnet 110 of the eighth embodiment is broadened to make the magnet 110 cover also the cavity 19. The magnet 110 of the upper mold 30 has a size equal to the magnet of the eighth embodiment shown in FIG. 17B.

In the ninth embodiment, metallic foreign matters entered the cavity 19 are attracted and attached to the inner surface of the cavity 19. It is therefore possible to prevent electric short circuits among bonding wires connected to the semiconductor chips 101.

In the embodiments shown in FIGS. 14A, 14B, 18A and 18B, metallic foreign matters are captured by disposing a magnet overlapping with the whole inner surfaces of the cavities. The magnet may be disposed in a specified area not influencing the operation of semiconductor chips even if metallic foreign matters are concentrated on this area. Namely, the magnet may be disposed so as to concentrate metallic foreign matters on an area remote from semiconductor chips and bonding wires.

The present invention has been described in connection with the preferred embodiments. The invention is not limited only to the above embodiments. It will be apparent to those skilled in the art that other various modifications, improvements, combinations, and the like can be made.

What are claimed are:

1. A mold for resin molding comprising:
   a pot for accommodating resin;
   a cavity for accommodating a resin molding target;
   a runner for transporting the resin accommodated in the pot to the cavity;
   a foreign matter retention pocket disposed at a bottom of the runner and being a recess; and
   a first magnet disposed at a position below a bottom surface of the foreign matter retention pocket.

2. The mold for resin molding according to claim 1, wherein a meshed member is disposed at the runner and magnetized by the first magnet.

3. The mold for resin molding according to claim 1, further comprising:
   a plunger for applying a pressure to the resin accommodated in the pot to inject the resin into the cavity; and
   a second magnet disposed in the plunger at a position corresponding to the resin.

4. A mold for resin molding comprising:
   a pot for accommodating resin;
   a cavity for accommodating a resin molding target;
   a runner for transporting the resin accommodated in the pot to the cavity;
   a foreign matter retention pocket disposed in the runner near the pot; and
   an ejector pin disposed in the cavity, wherein at least a projection portion of the ejector pin in the cavity is magnetized.

5. The mold for resin molding according to claim 4, further comprising:
   a first magnet disposed at the foreign matter retention pocket.

* * * * *